US012588424B2

(12) United States Patent
Tanigawa et al.

(10) Patent No.: US 12,588,424 B2
(45) Date of Patent: Mar. 24, 2026

(54) NONVOLATILE MEMORY ELEMENT AND METHOD FOR MANUFACTURING THE SAME

(71) Applicant: Sony Semiconductor Solutions Corporation, Kanagawa (JP)

(72) Inventors: Hironobu Tanigawa, Kumamoto (JP); Eiji Kariyada, Kumamoto (JP); Hiroki Tanabe, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 806 days.

(21) Appl. No.: 17/793,569

(22) PCT Filed: Jan. 11, 2021

(86) PCT No.: PCT/JP2021/000592
§ 371 (c)(1),
(2) Date: Jul. 18, 2022

(87) PCT Pub. No.: WO2021/161700
PCT Pub. Date: Aug. 19, 2021

(65) Prior Publication Data
US 2023/0066075 A1     Mar. 2, 2023

(30) Foreign Application Priority Data

Feb. 12, 2020     (JP) ................................. 2020-021472

(51) Int. Cl.
*H10N 50/80*     (2023.01)
*H10B 61/00*     (2023.01)
(Continued)

(52) U.S. Cl.
CPC ............. *H10N 50/80* (2023.02); *H10B 61/22* (2023.02); *H10N 50/01* (2023.02); *H10N 50/85* (2023.02)

(58) Field of Classification Search
CPC ...... G11C 11/161; H10N 50/80; H10N 50/01; H10N 50/85; H10B 61/22; G11B 5/39
See application file for complete search history.

(56) References Cited

U.S. PATENT DOCUMENTS

2014/0286084 A1* 9/2014 Watanabe .............. H10N 50/80
                                                                  365/158
2019/0189172 A1* 6/2019 Higo ........................ G11C 11/16
2021/0036217 A1* 2/2021 Nozaki .................. H10B 61/00

FOREIGN PATENT DOCUMENTS

JP          2013-115301 A     6/2013
JP          2016-004589 A     1/2016
(Continued)

OTHER PUBLICATIONS

International Search Report issued in International Patent Application No. PCT/JP2021/000592 on Apr. 13, 2021 and English translation of same. 5 pages.
(Continued)

*Primary Examiner* — Vongsavanh Sengdara
(74) *Attorney, Agent, or Firm* — K&L Gates LLP

(57) ABSTRACT

A variable-resistance nonvolatile memory element 11 of the present disclosure has a stack 30 including at least a magnetization fixed layer 31, an intermediate layer 32, and a storage layer 33, and a nonmagnetic material 36 is dispersed in at least one of the magnetization fixed layer 31 and the storage layer 33.

14 Claims, 18 Drawing Sheets

(51) Int. Cl.
　　*H10N 50/01*　　　　(2023.01)
　　*H10N 50/85*　　　　(2023.01)

(56) References Cited

FOREIGN PATENT DOCUMENTS

WO　　WO2017/208653　A1　12/2017
WO　　WO2018/179961　A1　10/2018

OTHER PUBLICATIONS

Written Opinion issued in International Patent Application No. PCT/JP2021/000592 on Apr. 13, 2021. 4 pages.
M. Hosomi et al., "A Novel Nonvolatile Memory with Spin Torque Transfer Magnetization Switching: Spin-RAM," IEDM Tech. Dig. PP. 459-462 (2005).

* cited by examiner (A) RECORDING OF INFORMATION "0"     (B) RECORDING OF INFORMATION "1"

11

36 NONMAGNETIC MATERIAL
30B
35 CAP LAYER
36
30 — 33 STORAGE LAYER
32 INTERMEDIATE LAYER
31 MAGNETIZATION FIXED LAYER
31C
31B
31A
30A
34 BASE LAYER e⁻     67     e⁻     67

NONMAGNETIC MATERIAL

CAP LAYER

SECOND MAGNETIZATION FIXED LAYER

SECOND INTERMEDIATE LAYER

STORAGE LAYER

FIRST INTERMEDIATE LAYER

FIRST MAGNETIZATION FIXED LAYER

FIRST STACK

67

FIRST DIRECTION

SECOND DIRECTION

PULSE WIDTH (SECOND) OF WRITE VOLTAGE

WRITE TIME (NANOSECOND)

NONVOLATILE MEMORY ELEMENT AND METHOD FOR MANUFACTURING THE SAME

TECHNICAL FIELD

The present disclosure relates to a nonvolatile memory element and a method for manufacturing the same.

BACKGROUND ART

A magnetic random access memory (hereinafter abbreviated as "MRAM") using a magnetoresistive element as a storage element has been proposed. Since MRAM stores data on the basis of a magnetization direction of a magnetic body, MRAM can perform high-speed and almost infinite ($10^{15}$ times or more) rewriting, and has already been used in the fields of industrial automation, aircraft, and the like. In addition, MRAM is expected to be developed into a memory for code storage and a working memory in the future due to its high-speed operation and high reliability. Examples of such MRAM include a magnetic tunnel junction (MTJ) element having a tunnel magneto resistance (TMR) effect and constituted by a ferromagnetic layer (magnetization fixed layer)/an intermediate layer (tunnel barrier layer)/a ferromagnetic layer (storage layer). In the MTJ element, in a case where a magnetization direction in the magnetization fixed layer and a magnetization direction in the storage layer are relatively parallel to each other, low resistance is obtained, and in a case where the directions are relatively antiparallel to each other, high resistance is obtained. In addition, a resistance change ratio is known to be several tens % to several hundreds %.

By the way, in a conventional MTJ element, data is written by reversing a magnetization direction of a storage layer using a current induced magnetic field generated by causing a current to flow through wiring disposed near the MTJ element. However, such a method has a large problem that a write current increases with miniaturization in achieving a large-capacity memory array. Therefore, as a means for solving such a problem, a recording method not depending on a current induced magnetic field, that is, a magnetization reversal method has been studied. Above all, a spin transfer torque based magnetic random access memory (STT-MRAM) to which magnetization reversal by spin injection is applied has attracted attention.

The spin transfer torque based magnetic random access memory (hereinafter, simply referred to as a "nonvolatile memory element") is an element using application of torque to a storage layer (free layer) in which a magnetization direction is not fixed when, for example, spin-polarized electrons that have passed through a magnetization fixed layer fixed in a certain direction enter the storage layer. When a current of a certain current value or more flows, the magnetization direction of the storage layer is reversed. Various materials have been studied as a ferromagnetic body used in the nonvolatile memory element, but in general, a nonvolatile memory element having perpendicular magnetic anisotropy is considered to be more suitable for reducing power and increasing capacity than a nonvolatile memory element having in-plane magnetic anisotropy. This is because the perpendicular magnetization has a lower energy barrier to be surpassed at the time of spin torque magnetization reversal, and high magnetic anisotropy of a perpendicular magnetization film is more advantageous for maintaining thermal stability of a storage carrier miniaturized by increasing a capacity.

In addition, if DRAM can be replaced with a nonvolatile memory element, reduction in power consumption during device operation can be expected. In addition, if SRAM is replaced with a nonvolatile memory element, since the area of the nonvolatile memory element is smaller than that of SRAM, the area of a memory cell can be reduced. However, in a case where DRAM or SRAM is replaced with a nonvolatile memory element, it is a technical problem to increase a write speed and to reduce a current value necessary for writing. In particular, in a case where replacement of SRAM is assumed, a write speed of several nanoseconds to several tens of nanoseconds is required in a writing operation, but it is known that a current required for magnetization reversal rapidly increases as the write speed increases (see FIG. 16A and Non-Patent Document-1). Note that in FIG. 16A, the horizontal axis represents a pulse width (unit: second) of a write voltage, and the vertical axis represents a reverse current threshold $I_{th}$ (unit: microampere).

A nonvolatile memory element that can operate at a high speed with a small current is known from, for example, Japanese Patent Application Laid-Open No. 2013-115301. In the technology disclosed in this patent publication, a storage layer has a structure in which a first ferromagnetic layer, a coupling layer, and a second ferromagnetic layer are stacked in this order, the first ferromagnetic layer and the second ferromagnetic layer are magnetically coupled via the coupling layer, one of the first ferromagnetic layer and the second ferromagnetic layer is an in-plane magnetization layer having superior in-plane magnetization, the other is a perpendicular magnetization layer having superior perpendicular magnetization, and magnetization directions of the first ferromagnetic layer and the second ferromagnetic layer are inclined from a direction perpendicular to a film surface.

CITATION LIST

Patent Document

Patent Document 1: Japanese Patent Application Laid-Open No. 2013-115301

Non-Patent Document

Non-Patent Document 1: M. Hosomi et. al., IEDM Tech. Dig. Pp. 459-462 (2005)

SUMMARY OF THE INVENTION

Problems to be Solved by the Invention

In the technology disclosed in the patent publication described above, by making a part of the storage layer an in-plane magnetization layer, an easy magnetization axis of the storage layer is shifted from a stacking direction, and it is thereby possible to suppress "incubation time" during which magnetization reversal does not respond to spin torque, which appears immediately after a current flows in the storage layer. As a result, it is possible to write data in several tens of nanoseconds. However, the configuration of the storage layer in a stack of the storage layer, an intermediate layer, and a magnetization fixed layer is complicated.

Therefore, an object of the present disclosure is to provide a nonvolatile memory element that can operate at a high speed with a small current despite a simple configuration and structure, and to provide a manufacturing method for manufacturing the nonvolatile memory element.

Solutions to Problems

A variable-resistance nonvolatile memory element of the present disclosure for achieving the object described above has a stack including at least a magnetization fixed layer, an intermediate layer, and a storage layer, and a nonmagnetic material is dispersed in at least one of the magnetization fixed layer and the storage layer.

A method for manufacturing a variable-resistance nonvolatile memory element according to a first aspect of the present disclosure for achieving the object described above is a method for manufacturing a nonvolatile memory element having a stack including at least a magnetization fixed layer, an intermediate layer, and a storage layer, a nonmagnetic material being dispersed in the storage layer, the method including:

alternately stacking a storage layer-forming layer and the nonmagnetic material for forming the storage layer; and then subjecting the stack to heat treatment to disperse the nonmagnetic material in the storage layer.

A method for manufacturing a variable-resistance nonvolatile memory element according to a second aspect of the present disclosure for achieving the object described above is a method for manufacturing a nonvolatile memory element having a stack including at least a magnetization fixed layer, an intermediate layer, and a storage layer, a nonmagnetic material being dispersed in the magnetization fixed layer, the method including:

alternately stacking a magnetization fixed layer-forming layer and the nonmagnetic material for forming the magnetization fixed layer; and then subjecting the stack to heat treatment to disperse the nonmagnetic material in the magnetization fixed layer.

MODE FOR CARRYING OUT THE INVENTION

Figure 1A:
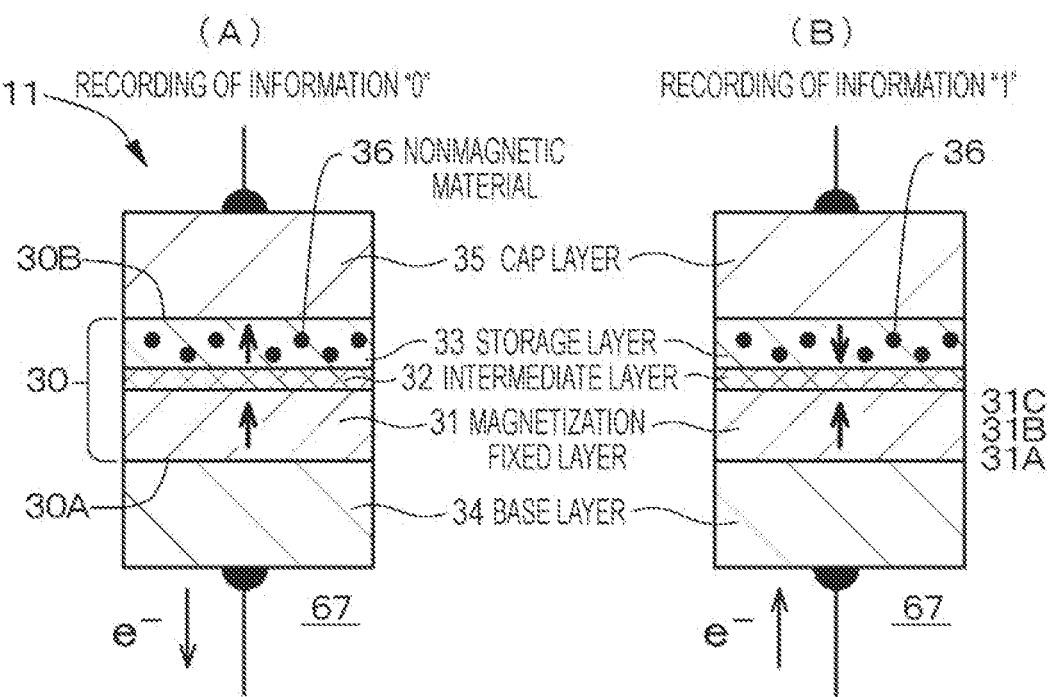
FIGS. 1A and 1B are a conceptual diagram of a nonvolatile memory element (spin transfer torque based magnetic random access memory to which spin transfer magnetization reversal is applied) of Example 1 and a conceptual diagram of a spin transfer torque based magnetic random access memory having a double spin filter structure, respectively.

Hereinafter, the present disclosure will be described on the basis of Examples with reference to the drawings. However, the present disclosure is not limited to Examples, and various numerical values and materials in Examples are illustrative. Note that description will be made in the following order.

1. General description of nonvolatile memory element of present disclosure and methods for manufacturing nonvolatile memory element according to first and second aspects of present disclosure 2. Example 1 (nonvolatile memory element of present disclosure)

3. Example 2 (method for manufacturing nonvolatile memory element according to first aspect of present disclosure)

4. Example 3 (method for manufacturing nonvolatile memory element according to second aspect of present disclosure)

5. Example 4 (modification of Example 1)

6. Example 5 (another modification of Example 1)

7. Example 6 (application example of nonvolatile memory elements of Examples 1 to 5)

8. Others

General Description of Nonvolatile Memory
Element of Present Disclosure and Methods for
Manufacturing Nonvolatile Memory Element
According to First and Second Aspects of Present
Disclosure In a method for manufacturing a nonvolatile memory element according to a first or second aspect of the present disclosure, the thickness of a nonmagnetic material can be a thickness less than a lattice constant of a material constituting the nonmagnetic material, specifically, a thickness less than the smallest lattice constant among lattice constants of the materials constituting the nonmagnetic material. Note that when the nonmagnetic material having such a thickness is formed, the formed nonmagnetic material is substantially formed in an island shape. The thickness of the nonmagnetic material for forming a storage layer at the time of formation is a set value (a set value of a thickness in a forming apparatus).

In the method for manufacturing a nonvolatile memory element according to the second aspect of the present disclosure including the preferable form described above, by alternately stacking a magnetization fixed layer-forming layer and a nonmagnetic material for forming a magnetization fixed layer, alternately stacking a storage layer-forming layer and the nonmagnetic material for forming a storage layer, and then subjecting the stack to heat treatment, the nonmagnetic material can be dispersed in the magnetization fixed layer and the storage layer. In addition, in this case, the thickness of the nonmagnetic material for forming each of the magnetization fixed layer-forming layer and the storage layer can be a thickness less than a lattice constant of a material constituting the nonmagnetic material, specifically, a thickness less than the smallest lattice constant among lattice constants of the materials constituting the nonmagnetic material. Note that when the nonmagnetic material having such a thickness is formed, the formed nonmagnetic material is not layered and is substantially formed in an island shape. The thickness of the nonmagnetic material for forming each of the magnetization fixed layer and the storage layer at the time of formation is a set value (a set value of a thickness in a forming apparatus).

In the nonvolatile memory element of the present disclosure or nonvolatile memory elements obtained by the methods for manufacturing a nonvolatile memory element according to the first and second aspects of the present disclosure including the preferable form described above (hereinafter, these may be collectively referred to as a "nonvolatile memory element or the like of the present disclosure"), the nonmagnetic material can be at least one nonmagnetic material selected from the group consisting of niobium (Nb), tungsten (W), tantalum (Ta), iridium (Ir), chromium (Cr), molybdenum (Mo), titanium (Ti), ruthenium (Ru), magnesium (Mg), MgO, zirconium (Zr), and hafnium (Hf), or an alloy material including two or more of the nonmagnetic materials.

In the nonvolatile memory element or the like of the present disclosure including the preferable form described above, the nonmagnetic material can be dispersed in the storage layer. In this case, the nonmagnetic material can be dispersed in the storage layer in an amount of 3.3% by mass to 20% by mass.

Alternatively, in the nonvolatile memory element or the like of the present disclosure including the preferable form described above, the nonmagnetic material can be dispersed in the magnetization fixed layer. In this case, the nonmagnetic material can be dispersed in the magnetization fixed layer in an amount of 3.3% by mass to 20% by mass.

Alternatively, in the nonvolatile memory element or the like of the present disclosure including the preferable form described above, the nonmagnetic material can be dispersed in the magnetization fixed layer and the storage layer. In this case, the nonmagnetic material can be dispersed in the storage layer in an amount of 3.3% by mass to 20% by mass, and the nonmagnetic material can be dispersed in the magnetization fixed layer in an amount of 3.3% by mass to 20% by mass.

Moreover, in the nonvolatile memory element or the like of the present disclosure including the above-described preferable form and configuration, a write voltage dependency of a write error rate can be steeper than a write voltage dependency of a write error rate in a nonvolatile memory element in which the nonmagnetic material is not dispersed. In this case, when the write error rate is represented by $WER_1$, the write error rate in the nonvolatile memory element in which the nonmagnetic material is not dispersed is represented by $WER_0$, and a write voltage is represented by $V_W$, $$1 < [\partial(WER_1)/\partial(V_W)]/[\partial(WER_0)/\partial(V_W)]$$

can be satisfied.

In the nonvolatile memory element or the like of the present disclosure, "dispersion" refers to a state in which one substance is scattered in a fine particle shape in another substance forming one phase. That is, "dispersion" refers to a state in which the nonmagnetic material is scattered in a fine particle shape in a substance constituting the storage layer and/or the magnetization fixed layer. In the storage layer and/or the magnetization fixed layer, preferably, the nonmagnetic material is not unevenly distributed (for example, not layered), but is randomly dispersed without variation in % by mass in a certain volume (or with little variation). A value of the median diameter (50% diameter, $D_{50}$) of the fine particle-shaped nonmagnetic material may be 0.05 nm to 0.15 nm, for example. Furthermore, dispersion of the nonmagnetic material can be evaluated on the basis of an energy dispersive X-ray analysis (EDX) method or a secondary ion mass spectrometry (SIMS) method.

The nonvolatile memory element or the like of the present disclosure including the above-described various preferable forms and configurations is electrically connected to a selection transistor. A combination of the nonvolatile memory element and the selection transistor may be referred to as a "memory cell". Then, the memory cells are arranged in a two-dimensional matrix in a first direction and a second direction different from the first direction to form a memory cell array. The selection transistor is disposed in a base portion (described later).

In the memory cell array, the nonvolatile memory element or the like of the present disclosure can be constituted by a perpendicular magnetization type spin transfer torque based magnetic random access memory (hereinafter, also simply referred to as a "spin transfer torque based magnetic random access memory"). However, the nonvolatile memory element or the like of the present disclosure is not limited to such a form, and can also be constituted by a perpendicular magnetization type magnetoresistive element and an in-plane magnetization type magnetoresistive element which are mixed, or an in-plane magnetization type magnetoresistive element. In the spin transfer torque based magnetic random access memory, a magnetization direction of the storage layer changes according to information to be stored, and in the storage layer, an easy magnetization axis is, for example, parallel to a stacking direction of the stack.

Memory cells adjacent to each other in the first direction can be element-separated by a transistor (also referred to as an "element separating transistor"). Note that the element separating transistor preferably has the same structure as the selection transistor. However, the form of the memory cells is not limited thereto, and the memory cells may be element-separated from each other by an element separating region.

In the memory cell array, a gate electrode of the selection transistor can be connected to a word line extending in the second direction (or also can serve as a word line). Furthermore, a projection image in a direction in which a bit line (second wiring) extends can be orthogonal to a projection image in a direction in which the word line extends, or the direction in which the bit line (second wiring) extends can be parallel to the direction in which the word line extends.

In the memory cell, the selection transistor can be constituted by a planar transistor, specifically, a field effect transistor (known MIS-FET or MOS-FET), or can be constituted by Fin-FET, whereby a short channel characteristic can be suppressed. Alternatively, in the selection transistor, a channel forming region can be constituted by a semiconductor element having a tri-gate structure or a semiconductor element having a gate-all-around (GAA) structure or an omega (Ω) structure (specifically, for example, FET in which a channel forming region is constituted by a nanowire or a nanosheet). The selection transistor may be an n-channel transistor or a p-channel transistor.

In the nonvolatile memory element or the like of the present disclosure, the magnetization fixed layer can be connected to one source/drain region of the selection transistor, or the storage layer can be connected to one source/drain region of the selection transistor.

A nonvolatile memory element constituted by a spin transfer torque based magnetic random access memory element has a stack including at least a magnetization fixed layer, an intermediate layer, and a storage layer, and a first surface (surface facing the selection transistor) of the stack is connected to a conductive base layer, and a second surface (surface facing the first surface) of the stack is in contact with the second wiring (bit line). The base layer is connected to one source/drain region of the selection transistor. Specifically, the base layer is connected to a contact hole connecting one source/drain region of the selection transistor and the stack to each other. That is, one source/drain region of the selection transistor and the stack are electrically connected to each other by the contact hole. The other source/drain region of the selection transistor is connected to a sense line (first wiring). Then, by causing a current (also referred to as a magnetization reversal current or a spin polarization current, which is a write current) to flow between the first wiring and the second wiring, information can be stored in the storage layer. That is, by causing a magnetization reversal current to flow in the stacking direction of the stack, the magnetization direction of the storage layer can be changed, and information can be stored and recorded in the storage layer.

As described above, the magnetization fixed layer can be connected to one source/drain region of the selection transistor via the base layer. That is, the magnetization fixed layer can constitute the first surface of the stack, whereby a material-stable stack can be obtained. However, the stack is not limited thereto, and as described above, the storage layer can constitute the first surface of the stack.

As described above, in the spin transfer torque based magnetic random access memory, a stack having a TMR effect or a giant magnetoresistance (GMR) effect can be constituted by the stack including the storage layer, the intermediate layer, and the magnetization fixed layer. In addition, for example, when a magnetization reversal current (a spin polarization current or a write current) flows from the storage layer to the magnetization fixed layer in a magnetization state of antiparallel arrangement, the magnetization of the storage layer is reversed by spin torque that acts by injection of electrons from the magnetization fixed layer to the storage layer, and the magnetization direction of the storage layer, the magnetization direction of the magnetization fixed layer (specifically, a reference layer), and the magnetization direction of the storage layer are parallel to each other. Meanwhile, for example, when a magnetization reversal current flows from the magnetization fixed layer to the storage layer in a magnetization state of parallel arrangement, the magnetization of the storage layer is reversed by spin torque that acts by flowing of electrons from the storage layer to the magnetization fixed layer, and the magnetization direction of the storage layer and the magnetization direction of the magnetization fixed layer (specifically, a reference layer) are antiparallel to each other. Alternatively, as illustrated in the conceptual diagram of FIG. 1B, a structure in which a stack having a TMR effect or a GMR effect is constituted by the magnetization fixed layer, the intermediate layer, the storage layer, the intermediate layer, and the magnetization fixed layer (double spin filter structure) can also be adopted. In such a structure, it is necessary to make a difference in change of magnetoresistance between two intermediate layers located above and below the storage layer.

Here, a metal atom constituting the magnetization fixed layer and the storage layer can contain a cobalt (Co) atom, an iron (Fe) atom, or a cobalt atom and an iron atom (Co—Fe). In other words, the metal atom constituting the magnetization fixed layer and the storage layer can contain at least a cobalt (Co) atom or an iron (Fe) atom. That is, the magnetization fixed layer and the storage layer can be constituted by a metal material (an alloy or a compound) containing at least cobalt (Co) or iron (Fe).

Alternatively, the storage layer can be constituted by at least one metal material (an alloy or a compound) selected from the group consisting of cobalt, iron, and nickel. Preferably, the storage layer can be constituted by a metal material (an alloy or a compound) containing cobalt, iron, and nickel, or a metal material (an alloy or a compound) containing cobalt, iron, nickel, and boron. Alternatively, examples of the material constituting the storage layer can include an alloy of a ferromagnetic material such as nickel (Ni), iron (Fe), or cobalt (Co) (for example, Co—Fe, Co—Fe—B, Co—Fe—Ni, Fe—Pt, Ni—Fe, Fe—B, or Co—B), and alloys obtained by adding gadolinium (Gd) to these alloys. Moreover, in the perpendicular magnetization type, in order to further increase perpendicular magnetic anisotropy, a heavy rare earth metal such as terbium (Tb), dysprosium (Dy), or holmium (Ho) may be added to such an alloy, or an alloy containing these heavy rare earth metals may be stacked. The crystallinity of the storage layer is essentially arbitrary, and may be polycrystalline, monocrystalline, or amorphous. Furthermore, the storage layer can have a single-layer configuration, a stacked configuration in which the above-described plurality of different ferromagnetic material layers is stacked, or a stacked configuration in which a ferromagnetic material layer and a nonmagnetic body layer are stacked.

Furthermore, it is also possible to add a nonmagnetic element to the material constituting the storage layer. By adding the nonmagnetic element, effects such as improvement in heat resistance due to prevention of diffusion, an increase in magnetoresistance effect, and an increase in dielectric strength due to planarization can be obtained. Examples of the nonmagnetic element to be added include B, C, N, O, F, Li, Mg, Si, P, Ti, V, Cr, Mn, Ni, Cu, Ge, Nb, Ru, Rh, Pd, Ag, Ta, Ir, Pt, Au, Zr, Hf, W, Mo, Re, and Os.

Moreover, ferromagnetic material layers having different compositions can be stacked as the storage layer. Alternatively, it is also possible to stack a ferromagnetic material layer and a soft magnetic material layer, or to stack a plurality of ferromagnetic material layers with a soft magnetic material layer or a nonmagnetic body layer interposed therebetween. In particular, in a case where a plurality of ferromagnetic material layers such as an Fe layer, a Co layer, an Fe—Ni alloy layer, a Co—Fe alloy layer, a Co—Fe—B alloy layer, an Fe—B alloy layer, and a Co—B alloy layer is stacked via a nonmagnetic body layer, it is possible to adjust a relationship in magnetic strength between the ferromagnetic material layers, and therefore it is possible to suppress a magnetization reversal current (also referred to as a spin polarization current) in a spin transfer torque based magnetic random access memory from increasing. Examples of a material of the nonmagnetic body layer include Ru, Os, Re, Ir, Au, Ag, Cu, Al, Bi, Si, B, C, Cr, Ta, Pd, Pt, Zr, Hf, W, Mo, Nb, V, and alloys thereof.

The thickness of the storage layer can be, for example, 0.5 nm to 30 nm, and the thickness of the magnetization fixed layer can be, for example, 0.5 nm to 30 nm.

The magnetization fixed layer can have a stacked ferri-structure (also referred to as a stacked ferri-pin structure) in which at least two magnetic material layers are stacked. One magnetic material layer constituting the stacked ferri-structure may be referred to as a "reference layer", and the other magnetic material layer constituting the stacked ferri-structure may be referred to as a "fixed layer". The stacked ferri-structure is a stacked structure having an antiferromagnetic coupling, that is, a structure in which an interlayer exchange coupling between two magnetic material layers (a reference layer and a fixed layer) is antiferromagnetic, and is also referred to as a synthetic antiferromagnet (SAF). The stacked ferri-structure refers to a structure in which an interlayer exchange coupling between two magnetic material layers is antiferromagnetic or ferromagnetic depending on the thickness of a nonmagnetic layer formed between the two magnetic material layers (a reference layer and a fixed layer), and is reported in, for example, S. S. Parkin et. al, Physical Review Letters, 7 May, pp 2304-2307 (1990). A magnetization direction of the reference layer is a magnetization direction serving as a reference of information to be stored in the storage layer. One magnetic material layer (reference layer) constituting the stacked ferri-structure is located on the storage layer side. That is, the reference layer is in contact with the intermediate layer. By adopting a stacked ferri-structure (also referred to as a stacked ferri-pin structure) for the magnetization fixed layer, asymmetry of thermal stability with respect to an information write direction can be reliably canceled, and stability against spin torque can be improved.

In addition, one magnetic material layer (for example, a reference layer) constituting the stacked ferri-structure contains at least one element selected from the group consisting of iron (Fe), cobalt (Co), and nickel (Ni), or contains at least one element selected from the group consisting of iron (Fe), cobalt (Co), and nickel (Ni), and boron (B). Specific examples thereof include a Co—Fe alloy, a Co—Fe—Ni alloy, a Ni—Fe alloy, and a Co—Fe—B alloy, and include a stacked structure such as Fe layer/Pt layer, Fe layer/Pd layer, Co layer/Pt layer, Co layer/Pd layer, Co layer/Ni layer, or Co layer/Rh layer. To these materials, a nonmagnetic element such as Ag, Cu, Au, Al, Si, Bi, Ta, B, C, O, N, Pd, Pt, Zr, Ta, Hf, Ir, W, Mo, Nb, V, Ru, or Rh may be added to adjust magnetic characteristics, or to adjust various physical properties such as crystal structure, crystallinity, and stability of a substance.

Meanwhile, the other magnetic material layer (for example, a fixed layer) constituting the stacked ferri-structure can include a material containing, as main components, at least one element selected from the group consisting of iron (Fe), cobalt (Co), nickel (Ni), and manganese (Mn) (referred to as "element-A" for convenience), and at least one element selected from the group consisting of platinum (Pt), palladium (Pd), nickel (Ni), manganese (Mn), iridium (Ir), and rhodium (Rh) (an element different from the above element-A and referred to as "element-B" for convenience).

Moreover, examples of a material constituting the non-magnetic layer include ruthenium (Ru), an alloy thereof, and a ruthenium compound, or alternatively include Os, Re, Ir, Au, Ag, Cu, Al, Bi, Si, B, C, Cr, Ta, Pd, Pt, Zr, Hf, W, Mo, Nb, V, Rh, Ti, and alloys thereof.

Alternatively, the fixed layer can have a stacked structure of Co thin film/Pt thin film, the reference layer can have a stacked structure of Co thin film/Pt thin film/CoFeB thin film (the CoFeB thin film is in contact with the intermediate layer) in order to increase an MR ratio, and a nonmagnetic layer containing, for example, Ru can be formed between the fixed layer and the reference layer.

However, the magnetization fixed layer is not limited to the form having a stacked ferri-structure. The magnetization fixed layer can be a magnetization fixed layer constituted by one layer and functioning as a reference layer. Examples of a material constituting such a magnetization fixed layer include a material (ferromagnetic material) constituting the storage layer. Alternatively, the magnetization fixed layer (reference layer) can be constituted by a stack of a Co layer and a Pt layer, a stack of a Co layer and a Pd layer, a stack of a Co layer and a Ni layer, a stack of a Co layer and a Tb layer, a Co—Pt alloy layer, a Co—Pd alloy layer, a Co—Ni alloy layer, a Co—Fe alloy layer, a Co—Tb alloy layer, a Co layer, an Fe layer, or a Co—Fe—B alloy layer. Alternatively, to these materials, a nonmagnetic element such as Ag, Cu, Au, Al, Si, Bi, Ta, B, C, O, N, Pd, Pt, Zr, Hf, Ir, W, Mo, Nb, V, Ru, or Rh may be added to adjust magnetic characteristics, or to adjust various physical properties such as crystal structure, crystallinity, and stability of a substance. Moreover, the magnetization fixed layer (reference layer) can be constituted by a Co—Fe—B alloy layer.

Alternatively, the magnetization direction of the magnetization fixed layer can be fixed by using an antiferromagnetic coupling between an antiferromagnetic layer and a ferromagnetic layer. Specific examples of the antiferromagnetic material include an Fe—Mn alloy, an Fe—Pt alloy, a Ni—Mn alloy, a Pt—Mn alloy, a Pt—Cr—Mn alloy, an Ir—Mn alloy, a Rh—Mn alloy, a Co—Pt alloy, a cobalt oxide, a nickel oxide (NiO), and an iron oxide ($Fe_2O_3$). Alternatively, to these materials, a nonmagnetic element such as Ag, Cu, Au, Al, Si, Bi, Ta, B, C, O, N, Pd, Pt, Zr, Ta, Hf, Ir, W, Mo, Nb, V, Ru, or Rh may be added to adjust magnetic characteristics, or to adjust various physical properties such as crystal structure, crystallinity, and stability of a substance. Moreover, examples of a material constituting the nonmagnetic layer include ruthenium (Ru), an alloy thereof, and a ruthenium compound, or alternatively include Os, Re, Ir, Au, Ag, Cu, Al, Bi, Si, B, C, Cr, Ta, Pd, Pt, Zr, Hf, W, Mo, Nb, V, Rh, and alloys thereof.

Since a magnetization direction of the magnetization fixed layer is a reference of information, the magnetization direction should not be changed by storing/recording or reading the information. However, the magnetization direction does not necessarily have to be fixed to a specific direction, and it is only required to adopt a configuration or a structure in which the magnetization direction of the magnetization fixed layer is less likely to change than that of the storage layer by setting the coercive force, the film thickness, or the magnetic damping constant of the magnetization fixed layer to be larger than those of the storage layer.

The intermediate layer preferably includes a nonmagnetic body material. That is, in the spin transfer torque based magnetic random access memory, the intermediate layer in a case where a stack having a TMR effect is constituted preferably includes an insulating nonmagnetic body material. The stack having a TMR effect constituted by the magnetization fixed layer, the intermediate layer, and the storage layer refers to a structure in which an intermediate layer constituted by a nonmagnetic body material film functioning as a tunnel insulating film is sandwiched between a magnetization fixed layer including a magnetic material and a storage layer including a magnetic material. Here, examples of the insulating nonmagnetic body material include various insulating materials such as magnesium oxide (MgO), magnesium nitride, magnesium fluoride, aluminum oxide ($AlO_x$), aluminum nitride (AlN), silicon oxide ($SiO_x$), silicon nitride (SiN), $TiO_2$, $Cr_2O_3$, Ge, NiO, $CdO_x$, $HfO_2$, $Ta_2O_5$, $Bi_2O_3$, $CaF_2$, $SrTiO_2$, $AlLaO_3$, Mg—$Al_2$—O, Al—N—O, BN, and ZnS, a dielectric material, and a semiconductor material. The intermediate layer including an insulating material preferably has an area resistance value of about several tens $\Omega \cdot \mu m^2$ or less. In a case where the intermediate layer includes magnesium oxide (MgO), the MgO layer is desirably crystallized, and more desirably has crystal orientation in the (001) direction. Furthermore, in a case where the intermediate layer includes magnesium oxide (MgO), the thickness thereof is desirably 1.5 nm or less. Meanwhile, examples of a material constituting the nonmagnetic body material film constituting the stack having a GMR effect include a conductive material such as Cu, Ru, Cr, Au, Ag, Pt, Ta, or an alloy thereof. An arbitrary nonmetallic material may be used if the nonmetallic material has a high conductivity (has a resistivity of several hundreds $\mu\Omega \cdot cm$ or less). However, it is desirable to appropriately select a material that hardly causes an interface reaction with the storage layer or the magnetization fixed layer.

The intermediate layer including an insulating nonmagnetic body material can be obtained, for example, by oxidizing or nitriding a metal layer (metal film) formed by a sputtering method. More specifically, in a case where aluminum oxide ($AlO_x$) or magnesium oxide (MgO) is used as the insulating material included in the intermediate layer, examples of the method for obtaining the intermediate layer include a method for oxidizing aluminum or magnesium formed by a sputtering method in the atmosphere, a method for plasma-oxidizing aluminum or magnesium formed by a sputtering method, a method for oxidizing aluminum or magnesium formed by a sputtering method with IPC plasma, a method for naturally oxidizing aluminum or magnesium formed by a sputtering method in oxygen, a method for oxidizing aluminum or magnesium formed by a sputtering method with oxygen radicals, a method for irradiating aluminum or magnesium formed by a sputtering method with an ultraviolet ray when the aluminum or magnesium is naturally oxidized in oxygen, a method for forming a film of aluminum or magnesium by a reactive sputtering method, and a method for forming a film of aluminum oxide ($AlO_x$) or magnesium oxide (MgO) by a sputtering method.

The three-dimensional shape of the stack is desirably a cylindrical shape or a columnar shape from a viewpoint of ensuring ease of processing and uniformity in a direction of an easy magnetization axis in the storage layer, but is not limited thereto, and may be a triangular prism, a quadrangular prism, a hexagonal prism, an octagonal prism, or the like (including those in which a side edge or a side ridge is rounded), or an elliptic cylinder. The area of the stack is preferably, for example, 0.01 $\mu m^2$ or less from a viewpoint of easily reversing the magnetization direction with a low magnetization reversal current. By causing a magnetization reversal current to flow through the stack from the first wiring (sense line) to the second wiring (bit line) or from the second wiring (bit line) to the first wiring (sense line) to cause the magnetization direction in the storage layer to be parallel to the easy magnetization axis or opposite to the easy magnetization axis, information is written in the storage layer The base layer is formed for improving the crystallinity of the magnetic material layer constituting the stack, and includes Ta, Cr, Ru, Ti, or the like. Furthermore, a cap layer can be formed between the second wiring (bit line) and the stack in order to prevent mutual diffusion between the second wiring (bit line) and atoms constituting the stack, to reduce contact resistance, and to prevent oxidation of the stack. However, in some cases, the bit line may be directly connected to the stack. In addition, in this case, the cap layer can be constituted by a single-layer structure including at least one material selected from the group consisting of hafnium, tantalum, tungsten, zirconium, niobium, molybdenum, titanium, vanadium, chromium, magnesium, ruthenium, rhodium, palladium, and platinum; a single-layer structure including an oxide such as a magnesium oxide layer, an aluminum oxide layer, a titanium oxide layer, a silicon oxide layer, a $Bi_2O_3$ layer, a $SrTiO_2$ layer, an $AlLaO_3$ layer, an Al—N—O layer, a Mg—Ti—O layer, or a $MgAl_2O_4$ layer; or a stacked structure of at least one material layer selected from the group consisting of hafnium, tantalum, tungsten, zirconium, niobium, molybdenum, titanium, vanadium, chromium, magnesium, ruthenium, rhodium, palladium, and platinum, and at least one oxide layer selected from the group consisting of MgTiO, MgO, AlO, and SiO (for example, Ru layer/Ta layer).

The various layers described above can be formed by, for example, a physical vapor deposition method (PVD method) exemplified by a sputtering method, an ion beam deposition method, or a vacuum vapor deposition method, or a chemical vapor deposition method (CVD method) typified by an atomic layer deposition (ALD) method. Furthermore, patterning of these layers can be performed by a reactive ion etching method (RIE method) or an ion milling method (ion beam etching method). The various layers are preferably formed continuously in a vacuum apparatus, and then preferably patterned.

The base layer, the second wiring (bit line), the first wiring (sense line), various types of other wiring, various other wiring layers, and the like may each have a single-layer structure of Ta or TaN, or Cu, Al, Au, Pt, Ti, Ru, W, or the like, or a compound thereof, or may each have a stacked structure of a base film including Cr, Ti, or the like, and a Cu layer, an Au layer, a Pt layer, or the like formed thereon. Alternatively, the base layer, the second wiring (bit line), the first wiring (sense line), various types of other wiring, various other wiring layers, and the like may each have a single-layer structure of Ta or a compound thereof, or a stacked structure with Cu, Ti, or the like, or a compound thereof. These electrodes and the like can be formed by, for example, a PVD method exemplified by a sputtering method.

A contact hole, a connection hole, and a pad portion electrically connecting the base layer and the source/drain region of the selection transistor to each other can include polysilicon doped with impurities, a high melting point metal such as tungsten, Ti, Pt, Pd, Cu, TiW, TiNW, WSi$_2$, or MoSi$_2$, or a metal silicide, and can be formed on the basis of a CVD method or a PVD method exemplified by a sputtering method. A barrier metal layer is formed on an inner wall or a bottom of the contact hole or the connection hole. Furthermore, examples of a material constituting various insulating layers and various interlayer insulating layers include silicon oxide (SiO$_2$), silicon nitride (SiN), SiON, SiOC, SiOF, SiCN, spin on glass (SOG), non-doped silicate glass (NSG), borophosphosilicate glass (BPSG), PSG, BSG, PbSG, AsSG, SbSG, LTO, and Al$_2$O$_3$. Alternatively, examples thereof include a low dielectric constant insulating material (for example, fluorocarbon, a cycloperfluorocarbon polymer, benzocyclobutene, a cyclic fluororesin, polytetrafluoroethylene, amorphous tetrafluoroethylene, polyaryl ether, fluorinated aryl ether, fluorinated polyimide, organic SOG, parylene, fluorinated fullerene, or amorphous carbon), a polyimide-based resin, a fluorine-based resin, Silk (trademark of The Dow Chemical Co., coating type low dielectric constant interlayer insulation film material), and Flare (trademark of Honeywell Electronic Materials Co., a poly-allyl ether (PAE)-based material). These materials can be used singly or in combination thereof appropriately. Alternatively, examples thereof include a high-K (high dielectric constant) film (for example, Hf oxide, Al$_2$O$_3$, Ru oxide, Ta oxide, Si oxide containing Al, Ru, Ta, or Hf, Si nitride containing Al, Ru, Ta, or Hf, and Si oxynitride containing Al, Ru, Ta, or Hf) that can be formed at a low temperature. Alternatively, examples thereof include an organic insulating material (organic polymer) exemplified by a straight chain hydrocarbon having a functional group capable of bonding to a control electrode at one end, such as polymethyl methacrylate (PMMA); polyvinyl phenol (PVP); polyvinyl alcohol (PVA); polyimide; polycarbonate (PC); polyethylene terephthalate (PET); polystyrene; a silanol derivative (silane coupling agent) such as N-2 (aminoethyl) 3-aminopropyltrimethoxysilane (AEAPTMS), 3-mercaptopropyltrimethoxysilane (MPTMS), or octadecyl trichlorosilane (OTS); a novolac type phenol resin; a fluorine-based resin; octadecanethiol, or dodecyl isocyanate. A combination thereof can be also used. The various insulating film and the various interlayer insulating layers can be formed on the basis of a known method such as various CVD methods, a coating method, various PVD methods including a sputtering method and a vacuum vapor deposition method, various printing methods including a screen printing method, or a sol-gel method. The contact hole and the connection hole may be formed on the pad portion.

The base portion can be constituted by, for example, a silicon semiconductor substrate, or can be constituted by an SOI substrate (specifically, a silicon layer constituting an SOI substrate or the like). Examples of the SOI substrate include an SOI substrate formed on the basis of a smart cut method and a substrate bonding technique, an SOI substrate formed on the basis of separation by implantation of oxygen (SIMOX), and an SOI substrate in which an insulating layer is formed on a surface of a silicon semiconductor substrate and a silicon layer is formed on the insulating layer. Alternatively, the base portion can be constituted by an InGaAs layer or a Ge layer instead of the silicon layer.

Examples of an electronic device into which the nonvolatile memory element of the present disclosure is incorporated include a portable electronic device such as a mobile device, a game device, a music device, or a video device, a fixed electronic device, and a magnetic head. Furthermore, examples thereof include a storage device including the nonvolatile memory element of the present disclosure, and the nonvolatile memory element of the present disclosure can also be used as one time programmable memory (OTP memory).

Example 1

Figure 1B:
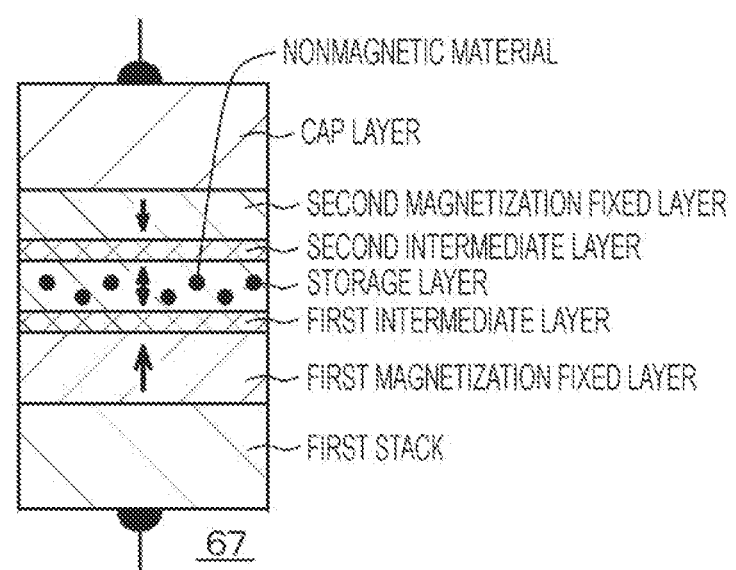
Figure 2:
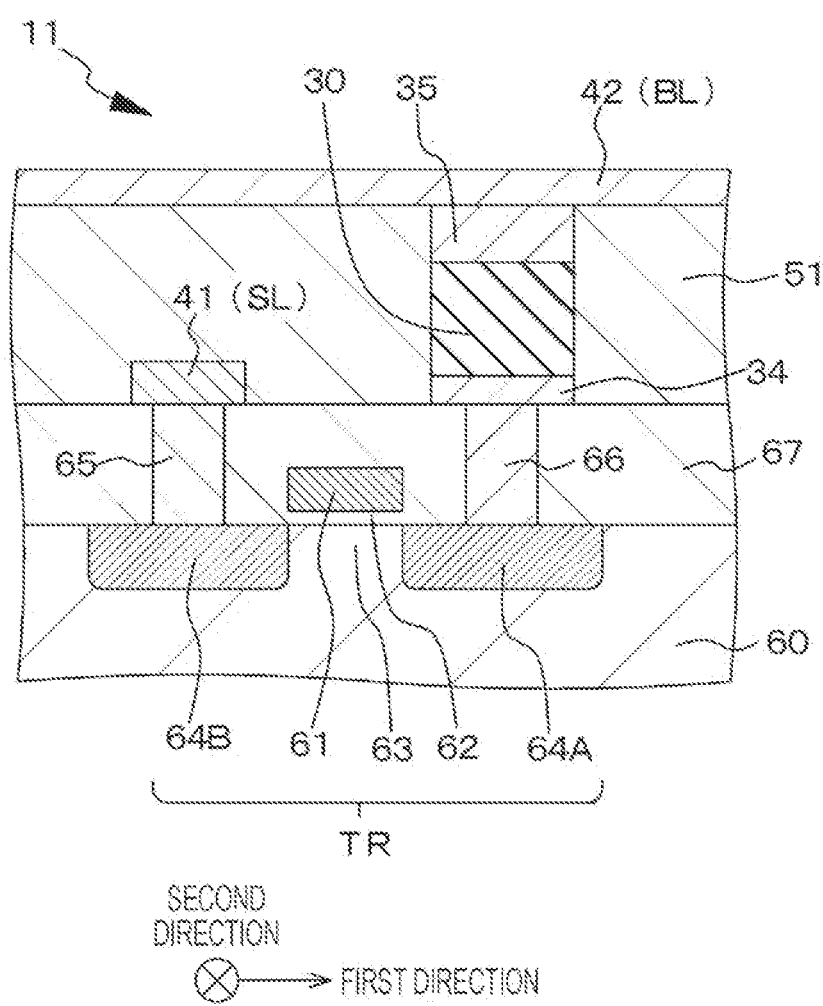
FIG. 2 is a schematic partial cross-sectional view of the nonvolatile memory element of Example 1.
Figure 3:
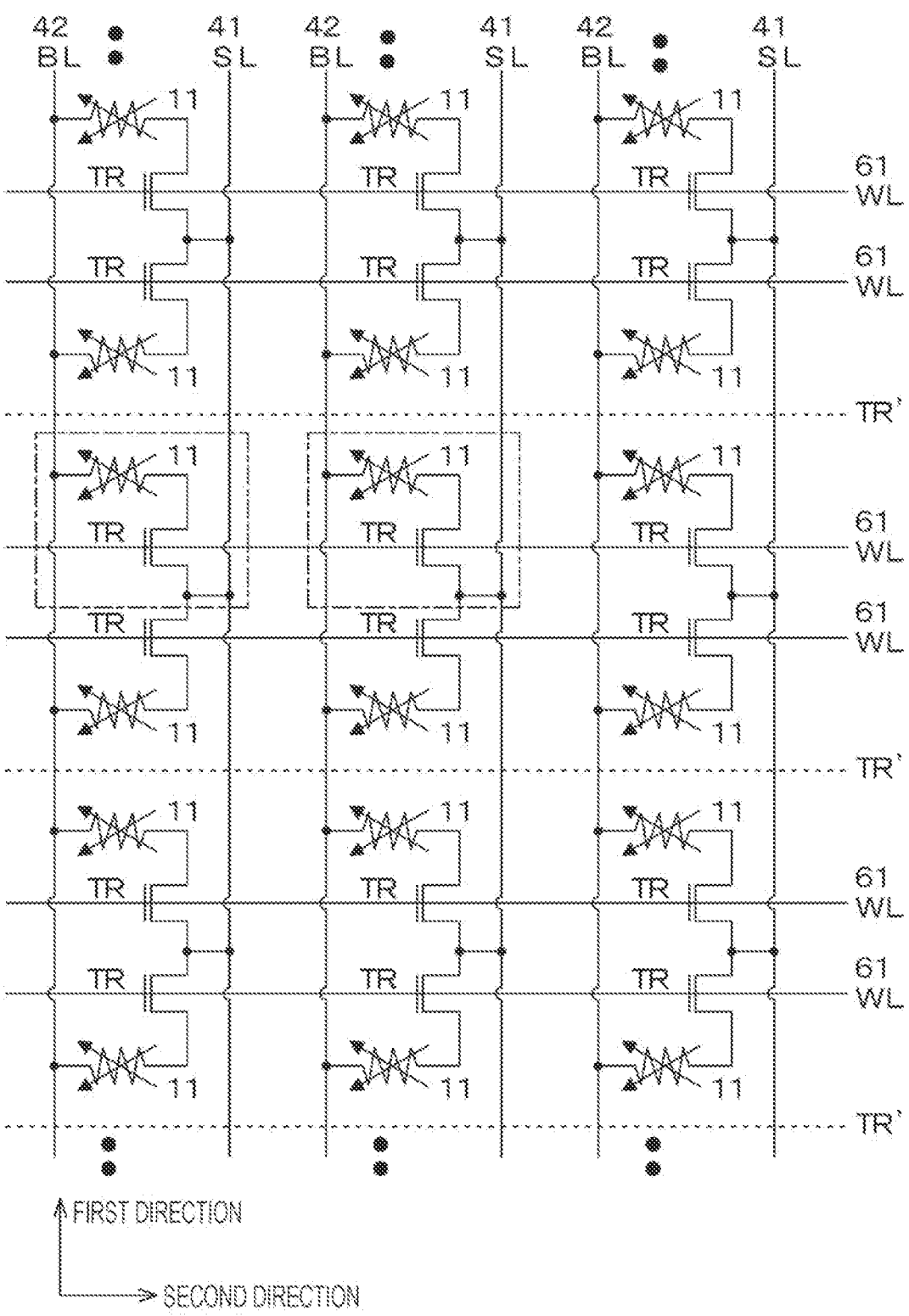
FIG. 3 is an equivalent circuit diagram of a memory cell array in Example 1.

Example 1 relates to the nonvolatile memory element of the present disclosure. FIG. 1A illustrates a conceptual diagram of a stack 30 and the like in the nonvolatile memory element (spin transfer torque based magnetic random access memory to which spin transfer magnetization reversal is applied) of Example 1, FIG. 2 illustrates a schematic partial cross-sectional view of the nonvolatile memory element of Example 1, FIG. 3 illustrates an equivalent circuit diagram of a memory cell array in Example 1, and FIG. 1B illustrates a conceptual diagram of a spin transfer torque based magnetic random access memory having a double spin filter structure. Note that, in FIG. 3, one memory cell is surrounded by a one-dot chain line, and the position of an element separating transistor disposed is indicated by a dotted line.

A variable-resistance nonvolatile memory element 11, 11', or 11" of Example 1 or Examples 2 to 5 described later has a stack 30 including at least a magnetization fixed layer 31, an intermediate layer 32, and a storage layer (also referred to as a magnetization reversal layer or a free layer) 33, and a nonmagnetic material 36 is dispersed in at least one of the magnetization fixed layer 31 and the storage layer 33.

The three-dimensional shape of the stack 30 in the nonvolatile memory element 11 is a cylindrical shape (columnar shape) or a quadrangular prism, but is not limited thereto. The stack 30 has a first surface 30A and a second surface 30B facing the first surface 30A. The magnetization fixed layer 31 is located on the first surface 30A side, and the storage layer 33 is located on the second surface 30B side. The first surface 30A of the magnetization fixed layer 31 is in contact with a base layer 34, and the base layer 34 is formed on an interlayer insulating layer 67 including SiO$_2$. A pad portion may be formed between the base layer 34 and the interlayer insulating layer 67.

A selection transistor TR is electrically connected to the nonvolatile memory element 11. In addition, the nonvolatile memory element 11 and the selection transistor TR constitute a memory cell, and the memory cells are arranged in a two-dimensional matrix in a first direction and a second direction to constitute a memory cell array. The memory cell constituting the memory cell array of Example 1 is a so-called "1T-1R" type memory cell.

The magnetization fixed layer 31 has a stacked ferri-structure (also referred to as a stacked ferri-pin structure) in which at least two magnetic material layers are stacked. A nonmagnetic layer 31B containing ruthenium (Ru) is formed between one magnetic material layer (reference layer) 31C constituting the stacked ferri-structure and the other magnetic material layer (fixed layer) 31A constituting the stacked ferri-structure.

The storage layer 33 includes a ferromagnetic material having a magnetic moment in which a magnetization direction freely changes in a stacking direction of the stack 30, more specifically, a Co—Fe—B alloy [(Co$_{20}$Fe$_{80}$)$_{80}$B$_{20}$]. The intermediate layer 32 including a nonmagnetic body material is constituted by an insulating layer functioning as a tunnel barrier layer (tunnel insulating layer), specifically, a magnesium oxide (MgO) layer. By constituting the intermediate layer 32 by a MgO layer, a magnetoresistance change ratio (MR ratio) can be increased, whereby efficiency of spin injection can be improved, and a magnetization reversal current density required for reversing the magnetization direction of the storage layer 33 can be reduced. Moreover, a cap layer 35 is formed in contact with the second surface 30B of the stack 30.

In the nonvolatile memory element of Example 1, the magnetization direction of the storage layer 33 changes according to information to be stored. In addition, in the storage layer 33, the easy magnetization axis is parallel to the stacking direction of the stack 30 (that is, perpendicular magnetization type). That is, the nonvolatile memory element of Example 1 is constituted by a perpendicular magnetization type spin transfer torque based magnetic random access memory. In other words, the nonvolatile memory element in Example 1 is constituted by an MTJ element. The magnetization direction of the reference layer 31C is a magnetization direction serving as a reference of information to be stored in the storage layer 33, and information "0" and information "1" are defined by a relative angle between the magnetization direction of the storage layer 33 and the magnetization direction of the reference layer 31C.

Moreover, in the memory cell array of Example 1 or Examples 2 to 5 described later, memory cells adjacent to each other in the first direction are element-separated by an element separating transistor TR' having the same structure as the selection transistor. Memory cells adjacent to each other in the second direction are element-separated by, for example, an element separating region having a shallow trench structure. By operation of the element separating transistor TR', a current can be prevented from flowing between memory cells (specifically, between the selection transistors TR). An extension portion of a gate electrode of the element separating transistor TR' extends in the second direction in parallel with the word line. Note that the element separating transistor TR' preferably has the same structure as the selection transistor TR.

The base layer 34 is connected to a contact hole 66. Specifically, the base layer 34 is formed on the contact hole 66. Furthermore, the cap layer 35 is connected to a bit line BL (second wiring 42). In addition, by causing a current (magnetization reversal current) to flow between a sense line SL (first wiring 41) and the bit line BL (second wiring 42), information is stored in the storage layer 33. That is, by causing a magnetization reversal current to flow in the stacking direction of the stack 30, the magnetization direction of the storage layer 33 is changed, and information is stored and recorded in the storage layer 33. As described above, the easy magnetization axis in the reference layer 31C is parallel to the stacking direction of the stack 30. That is, the reference layer 31C includes a ferromagnetic material having a magnetic moment in which a magnetization direction changes in a direction parallel to the stacking direction of the stack 30, more specifically, a Co—Fe—B alloy [$(Co_{20}Fe_{80})_{80}B_{20}$]. Moreover, the fixed layer 31A is constituted by a Co—Pt alloy layer, and constitutes a stacked ferri-structure magnetically coupled to the reference layer 31C via the nonmagnetic layer 31B containing ruthenium (Ru).

In the nonvolatile memory element in Example 1 or Examples 2 to 5 described later, the nonmagnetic material 36 contains fine particle-shaped molybdenum (Mo). In addition, in Example 1, the nonmagnetic material 36 is dispersed (mixed) in the storage layer 33, and the nonmagnetic material 36 is dispersed in the storage layer 33 in an amount of 3.3% by mass to 20% by mass. Furthermore, a value of the median diameter (50% diameter, $D_{50}$) of the fine particle-shaped nonmagnetic material 36 may be, for example, 0.05 nm to 0.15 nm.

Various layer configurations in Example 1 or Examples 2 to 5 described later are listed in Table 1 below.

TABLE 1

| | |
|---|---|
| Cap layer 35: | stack of a Ta layer having a film thickness of 1 nm and a Ru layer having a film thickness of 5 nm |
| Stack 30 | |
| Storage layer 33: | $(Co_{20}Fe_{80})_{80}B_{20}$ layer having a film thickness of 1.5 nm |
| Nonmagnetic material 36: | molybdenum (Mo) fine particles |
| Intermediate layer 32: | MgO layer having a film thickness of 1.0 nm |
| Magnetization fixed layer 31 | |
| Reference layer 31C: | $(Co_{20}Fe_{80})_{80}B_{20}$ layer having a film thickness of 1.0 nm |
| Nonmagnetic layer 31B: | Ru layer having a thickness of 0.8 nm |
| Fixed layer 31A: | Co—Pt alloy layer having a thickness of 2.5 nm |
| Base layer 34: | Ta layer having a thickness of 5 nm |

As FIG. 2 illustrates a schematic partial cross-sectional view of the nonvolatile memory element (memory cell) of Example 1 including a nonvolatile memory element and a selection transistor, the selection transistor TR) constituted by a field effect transistor is disposed below the stack 30. Specifically, the nonvolatile memory element (memory cell) of Example 1 includes:

the selection transistor TR formed in a semiconductor substrate 60; and the interlayer insulating layer 67 covering the selection transistor TR, in which the first wiring 41 (sense line SL) is formed on the interlayer insulating layer 67, the first wiring 41 is electrically connected to the other source/drain region 64B of the selection transistor TR via the connection hole 65 (or the connection hole and a landing pad portion, or lower layer wiring in some cases) formed in the interlayer insulating layer 67, the base layer 34, the stack 30, the cap layer 35, and an insulating material layer 51 surrounding the base layer 34, the stack 30, and the cap layer 35 are formed on the interlayer insulating layer 67, the stack 30 is electrically connected to one source/drain region 64A of the selection transistor via the contact hole 66 formed in the interlayer insulating layer 67 via the base layer 34, and the bit line BL (second wiring 42) in contact with the stack 30 via the cap layer 35 is formed on the insulating material layer 51.

The selection transistor TR includes a gate electrode 61, a gate insulating layer 62, a channel forming region 63, and the source/drain regions 64A and 64B. As described above, the other source/drain region 64B and the sense line SL (first wiring 41) are connected to the sense line SL (first wiring 41) formed on the interlayer insulating layer 67 via the connection hole 65 including a tungsten plug. Furthermore, the one source/drain region 64A is connected to the stack 30 via the contact hole 66 and the base layer 34. The gate electrode 61 also functions as a so-called word line WL or an address line. In addition, a projection image in a direction in which the second wiring 42 (bit line BL) extends is orthogonal to a projection image in a direction in which the gate electrode 61 (word line WL) extends, and is parallel to a projection image in a direction in which the sense line SL (first wiring 41) extends. However, in FIG. 2, in order to simplify the drawing, the directions in which the gate electrode 61, the first wiring 41, and the second wiring 42 extend are different from these.

Hereinafter, a method for manufacturing the nonvolatile memory element of Example 1 will be described.

[Step-100]

First, a selection transistor constituting a memory cell is formed in a base portion, and then an interlayer insulating layer is formed on the entire surface. Specifically, the selection transistor TR including the gate insulating layer 62, the gate electrode 61, and the source/drain regions 64A and 64B is formed in the silicon semiconductor substrate 60 corresponding to the base portion on the basis of a known method. A portion of the silicon semiconductor substrate 60 located between the source/drain regions 64A and 64B corresponds to the channel forming region 63. Furthermore, the element separating transistor TR' having the same structure as the selection transistor TR is formed between the memory cells. Subsequently, the interlayer insulating layer 67 is formed on the entire surface, the connection hole 65 is formed in a portion of the interlayer insulating layer 67 above the other source/drain region 64B, and moreover, the sense line SL (first wiring 41) is formed on the interlayer insulating layer 67. Furthermore, the contact hole 66 is formed in a portion of the interlayer insulating layer 67 above the one source/drain region 64A. If necessary, a pad portion in contact with the contact hole 66 may be formed on the interlayer insulating layer 67.

[Step-110]

Thereafter, a stacked film for forming a nonvolatile memory element, which is electrically connected to the selection transistor TR constituting the memory cell, is formed on the interlayer insulating layer 67, and then the stacked film is patterned (specifically, etching) to form the nonvolatile memory element 11. Specifically, the base layer 34, the stack 30, and the cap layer 35 are continuously formed on the entire surface of the interlayer insulating layer 67 on the basis of, for example, a magnetron sputtering method, and subsequently the cap layer 35, the stack 30, and the base layer 34 are patterned on the basis of a reactive ion etching method (RIE method) or an ion milling method (ion beam etching method). The base layer 34 is in contact with the contact hole 66. Note that, in formation of the storage layer 33, it is only required to use a sputtering target containing a material constituting the storage layer 33 and the nonmagnetic material 36.

[Step-120]

Next, the insulating material layer 51 is formed on the entire surface, and the insulating material layer 51 is planarized such that a top surface of the insulating material layer 51 is at the same level as a top surface of the cap layer 35. Thereafter, the bit line BL (second wiring 42) in contact with the cap layer 35 is formed on the insulating material layer 51. In this way, the nonvolatile memory element (specifically, spin transfer torque based magnetic random access memory) having the structure illustrated in FIGS. 1A and 2 can be obtained. Then, in a subsequent manufacturing process such as interlayer film formation, a temperature of 350° C. to 400° C. is usually applied, and as a result, the nonmagnetic material 36 is diffused in the storage layer 33, and the nonmagnetic material 36 is dispersed in the storage layer 33. Note that, in normal heat treatment, a temperature of 350° C. to 400° C. is applied for several minutes, but in a case where a substrate on which a nonvolatile memory element (memory cell array) is formed and a substrate on which an imaging element is formed are bonded to each other, a temperature of 350° C. to 400° C. is applied for about one to four hours.

As described above, a general MOS manufacturing process can be applied to manufacture of the nonvolatile memory element in Example 1, and the nonvolatile memory element can be applied as a general-purpose memory.

In a case of a variable-resistance nonvolatile memory element that stores binary information, the nonvolatile memory element is a type of so-called variable resistance element that takes two states of a high resistance state (HRS) and a low resistance state (LRS), and the states are associated with, for example, "1" and "0", respectively. In addition, in general, the 0/1 state of the variable-resistance nonvolatile memory element is determined by whether a resistance value thereof is higher or lower than a reference resistance value for comparison, which is also called a reference resistance value, and a sense amplifier for performing this comparison determination is disposed. The reference resistance value is often combined on the basis of a plurality of memory elements in which HRS or LRS is written in advance (these are referred to as "reference elements"). That is, the reference resistance value is generated as an average value of a resistance value in HRS and a resistance value in LRS. In the nonvolatile memory element of Example 1 or Examples 2 to 4 described later, at the time of reading data, a voltage appearing in the sense line SL is compared with a reference voltage, and it is determined whether data "1" is stored or "0" is stored depending on the level of the voltage.

By the way, information is defined by the direction of the magnetization direction of the storage layer 33 having uniaxial anisotropy. Information is written by causing a magnetization reversal current (spin polarization current) to flow in the stacking direction of the stack 30 to cause spin torque magnetization reversal. Hereinafter, the spin torque magnetization reversal will be briefly described with reference to FIG. 1A which is a conceptual diagram of a spin transfer torque based magnetic random access memory to which spin transfer magnetization reversal is applied. Electrons have two types of spin angular momenta. These are defined as an upward momentum and a downward momentum. The number of upward momenta is the same as that of downward momenta in a nonmagnetic body, and the number of upward momenta is different from that of downward momenta in a ferromagnetic body.

It is assumed that directions of magnetic moments of the storage layer 33 and the reference layer 31C each including a ferromagnetic material are antiparallel to each other. In this state, information "1" is stored in the storage layer 33. It is assumed that the information "1" stored in the storage layer 33 is rewritten to "0". In this case, a magnetization reversal current (spin polarization current) is caused to flow from the storage layer 33 to the magnetization fixed layer 31 from the state illustrated in the conceptual diagram of (B) of FIG. 1A. That is, electrons are caused to flow from the magnetization fixed layer 31 toward the storage layer 33. Electrons that have passed through the reference layer 31C cause spin polarization, that is, a difference is generated between the number of upward momenta and the number of downward momenta. When the intermediate layer 32 is sufficiently thin and electrons reach the storage layer 33 before the spin polarization is relaxed to be in a non-polarized state (state in which the number of upward momenta is the same as that of downward momenta) in a normal nonmagnetic body, the signs of the spin polarization degrees are reversed, and therefore some electrons are reversed, that is, the directions of the spin angular momenta of some electrons are changed in order to lower the energy of the entire system. At this time, since the total angular momentum of the system needs to be stored, a reaction equivalent to the sum of angular momentum changes due to electrons that have changed the directions is applied to the magnetic moment in the storage layer 33. In a case where a current, that is, the number of electrons passing through the stack 30 in a unit time is small, the total number of electrons that change the directions is also small. Therefore, the angular momentum change generated in the magnetic moment in the storage layer 33 is also small. However, when the current increases, a large amount of angular momentum change can be applied to the storage layer 33 in a unit time. The temporal change in the angular momentum is torque, and when the torque exceeds a certain threshold, the magnetic moment of the storage layer 33 starts to be reversed, and becomes stable when the magnetic moment is rotated by 180 degrees due to uniaxial anisotropy thereof. That is, reversal from the antiparallel state to the parallel state occurs, and the information "0" is stored in the storage layer 33 (see the conceptual diagram of (A) of FIG. 1A).

Next, it is assumed that the information "0" stored in the storage layer 33 is rewritten to "1". In this case, a magnetization reversal current is caused to flow from the magnetization fixed layer 31 to the storage layer 33 from the state illustrated in the conceptual diagram of (A) of FIG. 1A. That is, electrons are caused to flow from the storage layer 33 toward the magnetization fixed layer 31. Electrons that have reached the reference layer 31C and has a downward spin pass through the magnetization fixed layer 31. Meanwhile, electrons having an upward spin are reflected by the reference layer 31C. Then, when such electrons enter the storage layer 33, the electrons apply torque to the storage layer 33, and the storage layer 33 is reversed to an antiparallel state (see the conceptual diagram of (B) of FIG. 1A). However, at this time, the amount of current required to cause reversal is larger than that in a case where reversal is caused from the antiparallel state to the parallel state. Although it is difficult to intuitively understand the reversal from the parallel state to the antiparallel state, it may be considered that reversal cannot be performed because the magnetization direction of the reference layer 31C is fixed, and the storage layer 33 is reversed in order to store the angular momentum of the entire system. As described above, the information of 0/1 is stored by causing a magnetization reversal current (spin polarization current) equal to or larger than a certain threshold corresponding to each polarity to flow in the direction from the magnetization fixed layer 31 to the storage layer 33 or in the direction opposite thereto.

As described above, the nonvolatile memory element 11 is connected to the selection transistor TR, and an upper limit is set to a current value (or a voltage value) that can flow depending on the performance of the selection transistor TR. Therefore, the current for reversing the magnetization of the storage layer 33 and causing transition of the magnetization from antiparallel to parallel or from parallel to antiparallel (referred to as "reversal current threshold $I_{th}$") needs to be designed so as to be sufficiently lower than the upper limit of the current value that can flow in the selection transistor TR. Moreover, since there is fluctuation of magnetization due to heat at a finite temperature, data writing itself is stochastic.

Figure 16A:
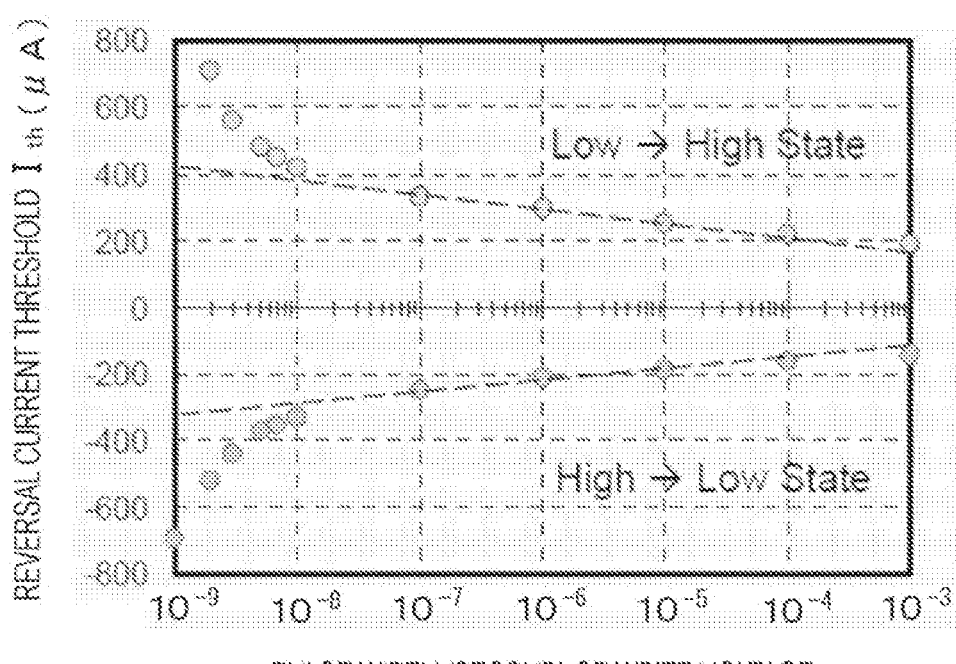
FIGS. 16A and 16B are a graph for explaining that a current required for magnetization reversal rapidly increases as a write speed increases, and a graph for explaining that a write voltage dependency of WER also becomes gentle in addition to an increase in a value of a reversal current threshold ($I_{th}$) at a write speed of several tens of nanoseconds or less, respectively.
Figure 16B:
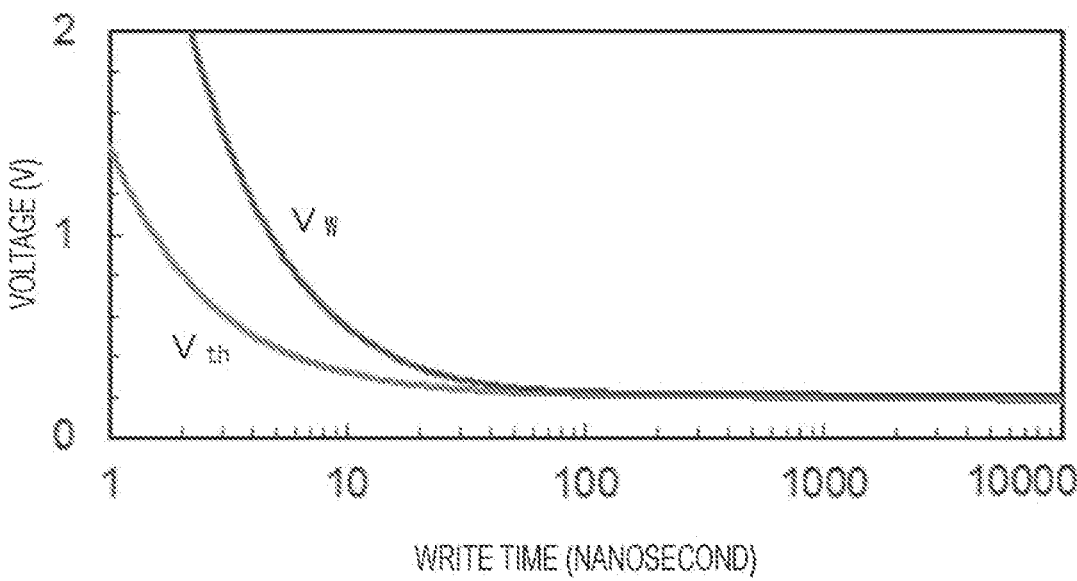

It is known that a write error rate (WER) decreases by increasing a current flowing through the nonvolatile memory element 11. It is necessary to satisfy $I_{th} \ll I_W \ll I_{max}$, in which $I_W$ and $I_{max}$ represent a write current with which WER is equal to or less than a specified numerical value and a maximum current that can flow through the nonvolatile memory element, respectively. Furthermore, since it is known that a write voltage dependency of WER is gentle in addition to a high value of $I_{th}$ at a write speed of several tens of nanoseconds or less, $I_W$ also increases. Therefore, it is often difficult to satisfy $I_{th} \ll I_W \ll I_{max}$ at a write speed of several tens of nanoseconds or less. Furthermore, as illustrated in FIG. 16B, a write voltage $V_W$ and a write threshold voltage $V_{th}$ rapidly increase at 40 nanoseconds or less. Note that in FIG. 16B, the graph of the write voltage $V_W$ indicates a write voltage for setting a value of WER to $1 \times 10^{-6}$ or less. Here, the write voltage $V_W$ is a write voltage when a write error occurs once in a case where information is written to the nonvolatile memory element $1 \times 10^6$ times at the write voltage $V_W$. Furthermore, the write threshold voltage $V_{th}$ is a voltage for reversing magnetization of the storage layer 33 and causing a transition of magnetization from antiparallel to parallel or from parallel to antiparallel.

There are two ways of thinking to reduce the write current or the write voltage in a short write time of several tens of nanoseconds or less. The reduction of the write voltage will be described below for convenience. A first method for reducing the write voltage is a method for reducing the write threshold voltage ($V_{th}$) itself. A second method is a method for making the write voltage dependency of WER steep.

Figure 10A:
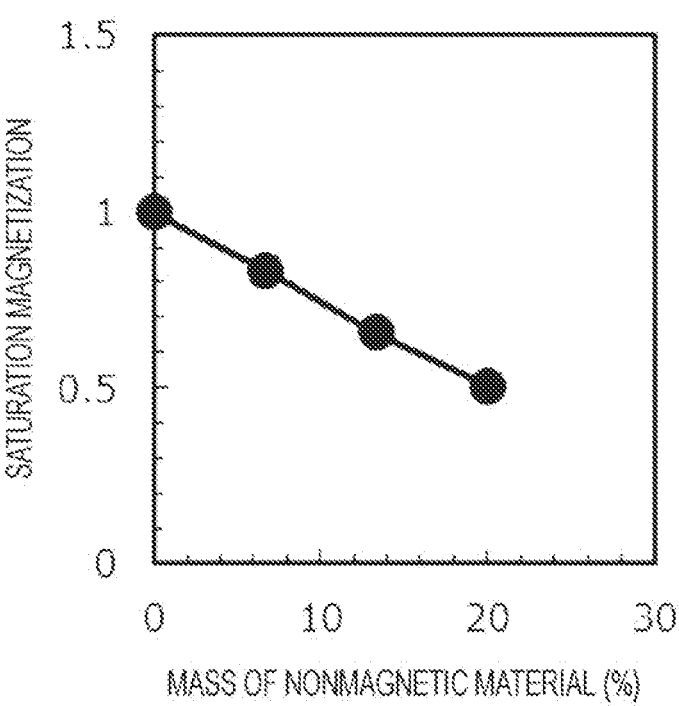
FIGS. 10A and 10B are a graph illustrating a relationship between a value of % by mass of a nonmagnetic material and a saturation magnetization $M_S$ of a storage layer, and a graph illustrating a relationship between a value of % by mass of a nonmagnetic material and an anisotropic magnetic field $H_K$ of the storage layer in the nonvolatile memory elements of Example 1 and Comparative Example 1, respectively.
Figure 10B:
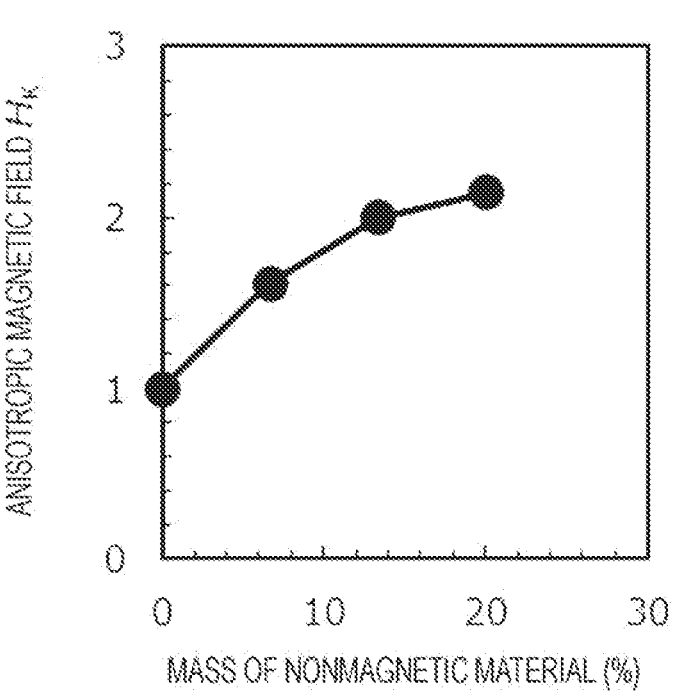
Figure 11:
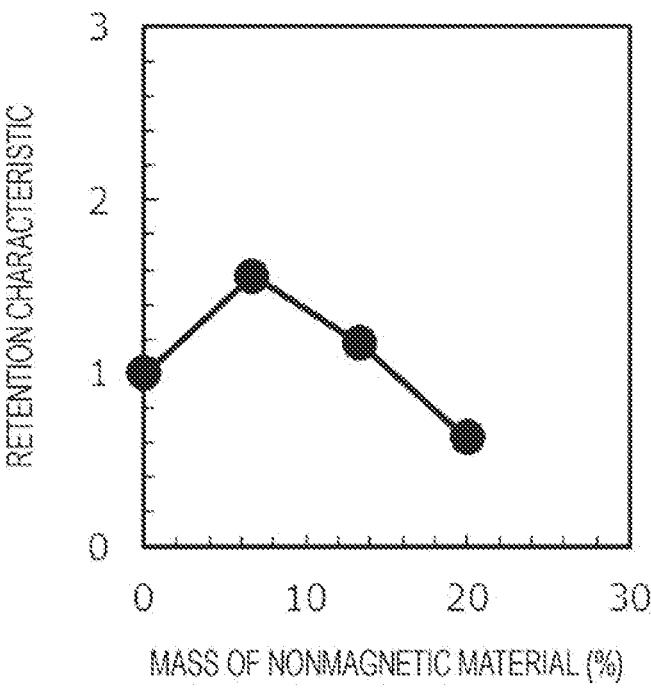
FIG. 11 is a graph illustrating a relationship between a value of % by mass of a nonmagnetic material and a retention characteristic of a storage layer in the nonvolatile memory elements of Example 1 and Comparative Example 1.

In the nonvolatile memory element 11 of Example 1 in which the nonmagnetic material 36 is dispersed in the storage layer 33, as illustrated in FIG. 10A, a saturation magnetization $M_S$ of the storage layer 33 tends to decrease as a value of % by mass of the nonmagnetic material 36 increases. Meanwhile, as illustrated in FIG. 10B, an anisotropic magnetic field $H_K$ of the storage layer 33 tends to increase as a value of % by mass of the nonmagnetic material 36 increases. The vertical axes in FIGS. 10A, 10B, and 11 are normalized by values of the saturation magnetization $M_S$, the anisotropic magnetic field $H_K$, and the retention characteristic of the nonvolatile memory element of Comparative Example 1 including a storage layer to which the nonmagnetic material 36 is not added, respectively. The retention characteristic of the storage layer 33 is generally proportional to a product of the saturation magnetization $M_S$ and the anisotropic magnetic field $H_K$. FIG. 11 illustrates the retention characteristic of the storage layer 33, and it can be seen that the retention characteristic temporarily increases and subsequently decreases as a value of % by mass of the nonmagnetic material 36 increases.

Regarding the content of the nonmagnetic material 36, it is known that an MR ratio related to a read characteristic tends to decrease as the content of the nonmagnetic material 36 in the storage layer 33 increases. When the MR ratio is low, a malfunction occurs during read operation. Therefore, at the time of forming the storage layer 33 including the nonmagnetic material 36, the ratio of the nonmagnetic material 36 to the storage layer 33 is desirably 20% by mass or less.

Furthermore, it is known that the write voltage dependency of WER can be steep by decreasing the saturation magnetization $M_S$ of the storage layer 33. Therefore, the write voltage dependency of WER can be steep without lowering the retention characteristic, that is, a set value of the write voltage can be reduced.

Figure 12:
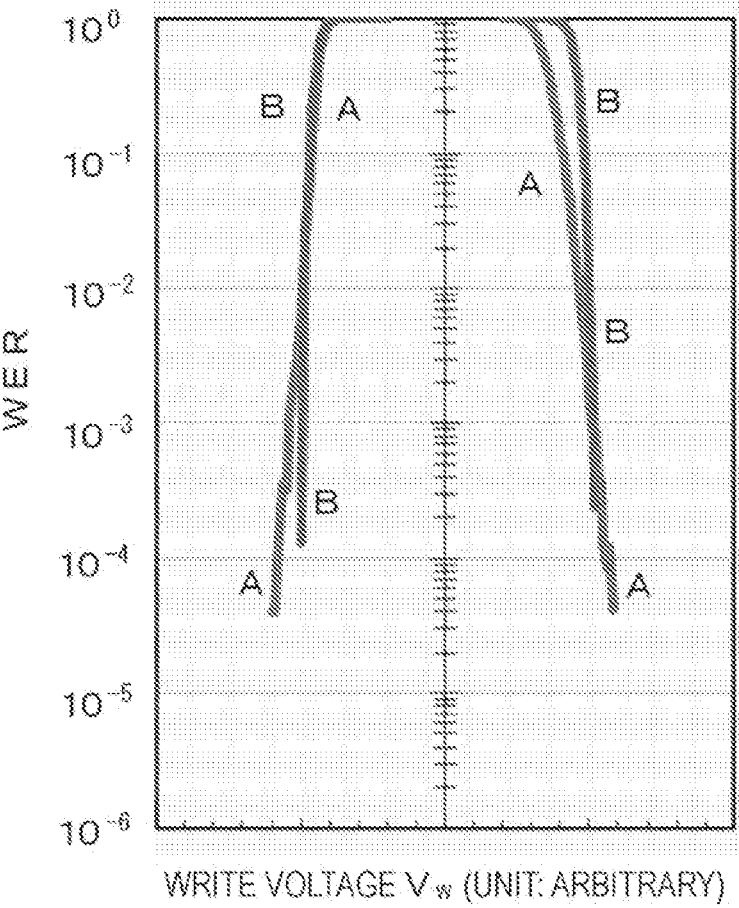
FIG. 12 is a graph illustrating WER evaluation results of the nonvolatile memory element 11 of Example 1 and a nonvolatile memory element of Comparative Example 1.

A WER evaluation result of the nonvolatile memory element 11 of Example 1 will be compared with a WER evaluation result of the nonvolatile memory element of Comparative Example 1 below. FIG. 12 illustrates a write voltage dependency of WER at a write pulse width of 20 nanoseconds. In FIG. 12, the right half illustrates WER when the magnetization directions of the storage layer 33 and the magnetization fixed layer 31 are reversed from an antiparallel state to a parallel state as illustrated in (A) of FIG. 1A (H→L reversal, storage of information "0"), and the left half illustrates a write voltage dependency of WER when the magnetization directions of the storage layer 33 and the magnetization fixed layer 31 are reversed from a parallel state to an antiparallel state as illustrated in (B) of FIG. 1A (L→H reversal, storage of information "1"). In FIG. 12, the WER curve indicated by "B" is the WER evaluation result of the nonvolatile memory element of Comparative Example 1, and the WER curve indicated by "A" is the WER evaluation result of the nonvolatile memory element of Example 1.

As is apparent from FIG. 12, in a region where a value of WER is less than $1\times10^{-3}$, it can be seen that the nonvolatile memory element 11 of Example 1 has a lower write voltage at the same value of WER than the nonvolatile memory element of Comparative Example 1. That is, it can be seen that a write voltage when a write error occurs once in a case where information is written into the nonvolatile memory element $1\times10^{3}$ times is lower in the nonvolatile memory element 11 of Example 1 than in the nonvolatile memory element of Comparative Example 1.

Figure 13:
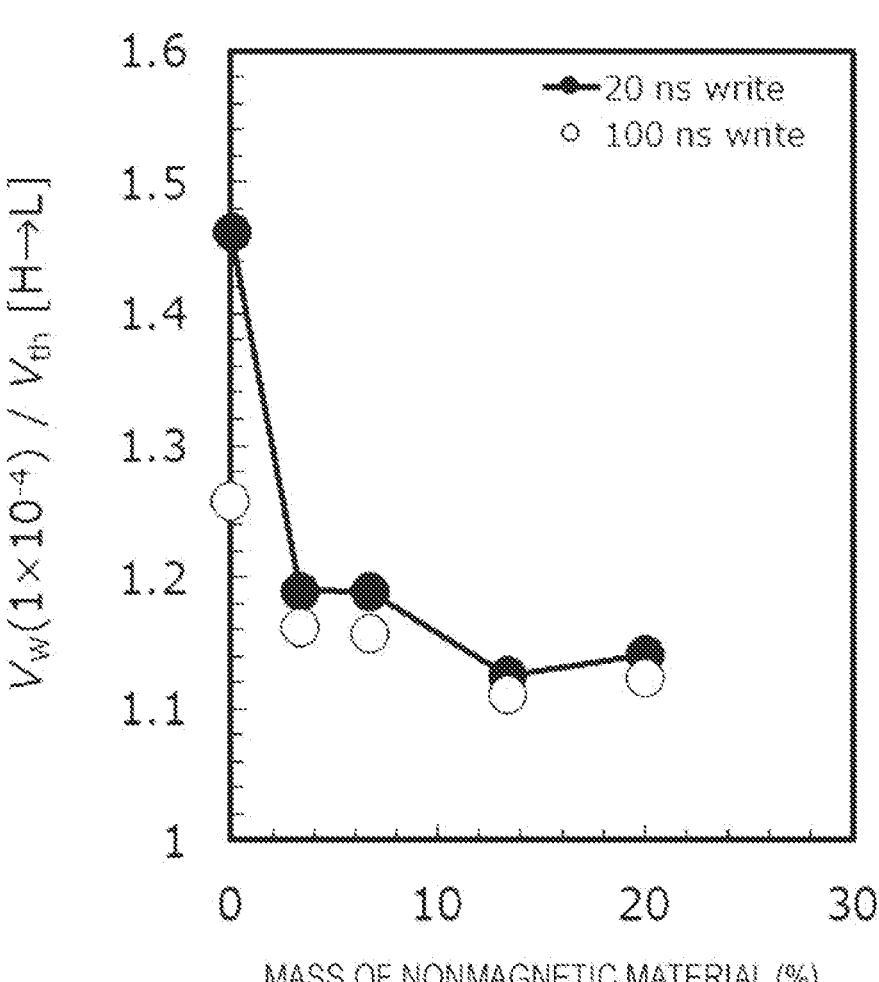
FIG. 13 is a graph illustrating writing characteristics at the time of H→L reversal in 100 nanoseconds and 20 nanoseconds in the nonvolatile memory element of Example 1.
Figure 14:
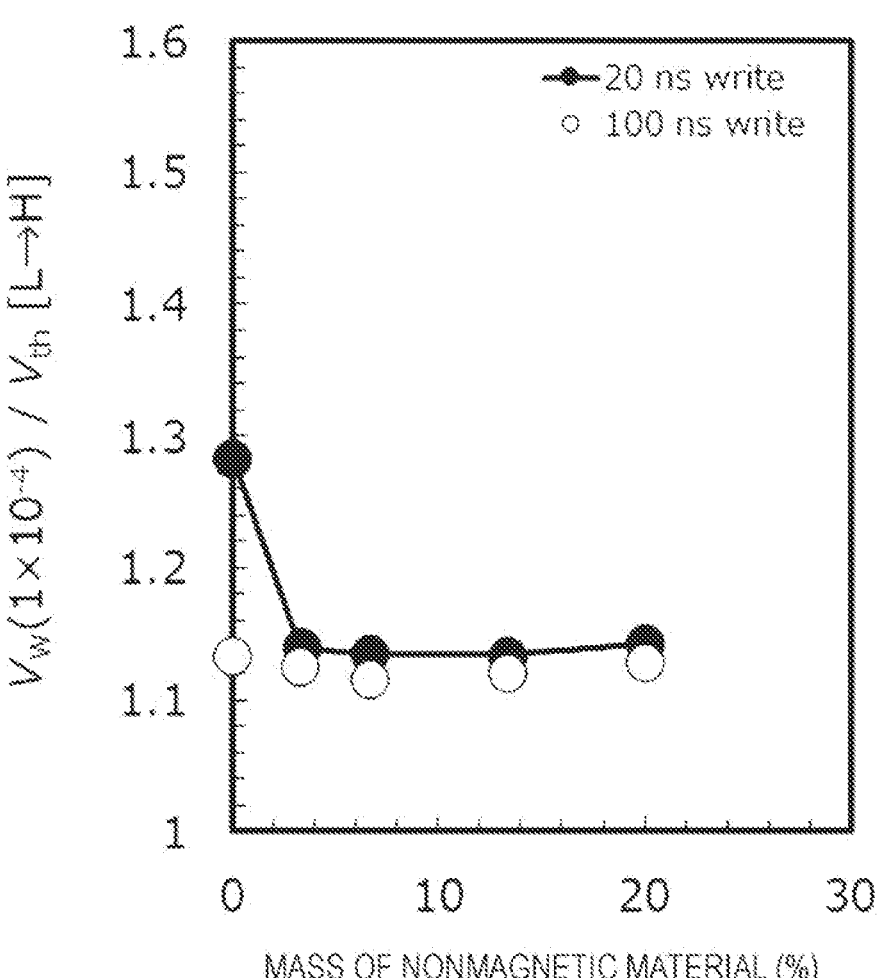
FIG. 14 is a graph illustrating writing characteristics at the time of L→H reversal in 100 nanoseconds and 20 nanoseconds in the nonvolatile memory element of Example 1.

Furthermore, FIG. 13 illustrates a relationship between the steepness of WER in H→L reversal ($V_W[\text{WER}=1\times10^{-4}]/V_{th}']$) and % by mass of the nonmagnetic material 36, and FIG. 14 illustrates a relationship between the steepness of WER in L→H reversal ($V_W[\text{WER}=1\times10^{-4}]/V_{th}']$) and % by mass of the nonmagnetic material 36. Here, "$V_{th}'$" is a value of the write voltage when a value of WER is $5\times10^{-1}$. That is, $V_{th}'$ is a write voltage when a write error occurs $5\times10^{3}$ times in a case where information is written $1\times10^{4}$ times in the nonvolatile memory element. Furthermore, "$V_W$ [WER=$1\times10^{-4}$]" means a write voltage $V_W$ when a write error occurs once in a case where information is written $1\times10^{4}$ times in the nonvolatile memory element.

Figure 15:
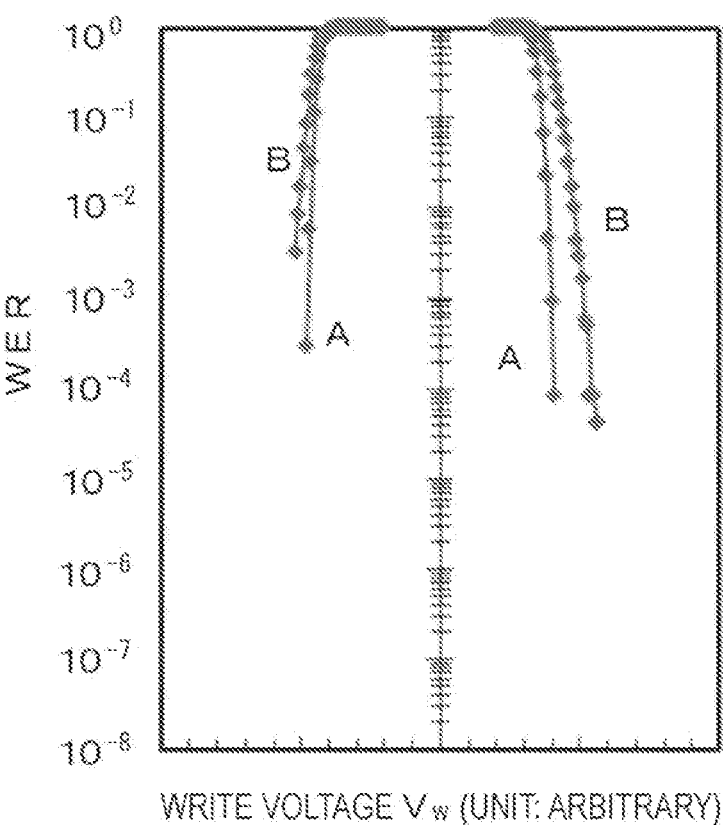
FIG. 15 is a graph illustrating WER evaluation results of the nonvolatile memory element of Example 1 in 100 nanoseconds and 20 nanoseconds.

Furthermore, for reference, FIG. 15 illustrates a graph illustrating WER evaluation results of the nonvolatile memory element of Comparative Example 1 including a storage layer to which the nonmagnetic material 36 is not added at write pulses of 100 nanoseconds and 20 nanoseconds. In FIG. 15, "A" indicates a result at a write pulse of 100 nanoseconds, and "B" indicates a result at a write pulse of 20 nanoseconds. Furthermore, the right half of FIG. 15 illustrates WER when the magnetization directions of the storage layer 33 and the magnetization fixed layer 31 are reversed from an antiparallel state to a parallel state as illustrated in (A) of FIG. 1A (H→L reversal, storage of information "0"), and the left half thereof illustrates WER when the magnetization directions of the storage layer 33 and the magnetization fixed layer 31 are reversed from a parallel state to an antiparallel state as illustrated in (B) of FIG. 1A (L→H reversal, storage of information "1").

Each of the H→L reversal and the L→H reversal was evaluated at write pulses of 100 nanoseconds and 20 nanoseconds. The gray dots indicate write pulses of 100 nanoseconds, and the black dots indicate write pulses of 20 nanoseconds. It can be seen that, in the nonvolatile memory element of Example 1 illustrated in FIG. 1A, a value of the steepness of WER ($V_W[\text{WER}=1\times10^{-4}]/V_{th}']$) is substantially equal between the write pulse of 20 nanoseconds and the write pulse of 100 nanoseconds. That is, it can be seen that by dispersing the nonmagnetic material 36 in the storage layer 33, the write voltage dependency of WER is steep in the short pulse writing of 20 nanoseconds. In other words, it can be seen that information can be written at a low write voltage $V_W$ even in the short pulse writing of 20 nanoseconds.

In addition, from the above results, it has been found that the nonmagnetic material 36 is preferably dispersed in the storage layer 33 in an amount of 3.3% by mass or more and 20% by mass or less.

Moreover, from the characteristics of writing at 20 nanoseconds in FIGS. 13 and 14, it is found that by dispersing the nonmagnetic material 36 in the storage layer 33 in an amount of 3.3% by mass or more, a value of the steepness of WER ($V_W[\text{WER}=1\times10^{-4}]/V_{th}']$) decreases. That is, in the nonvolatile memory element 11 of Example 1, a write voltage dependency of a write error rate is steeper than a write voltage dependency of a write error rate in the nonvolatile memory element 11 in which the nonmagnetic material 36 is not dispersed. When the write error rate is represented by $\text{WER}_1$, the write error rate in the nonvolatile memory element 11 in which the nonmagnetic material 36 is not dispersed is represented by $\text{WER}_0$, and a write voltage is represented by $V_W$, $$1<[\partial(\text{WER}_1)/\partial(V_W)]/[\partial(\text{WER}_0)/\partial(V_W)]$$

is satisfied. Note that in FIGS. 13 and 14, the characteristics of writing at 20 nanoseconds are indicated by black circles, and the characteristics of writing at 100 nanoseconds are indicated by white circles.

As described above, in the nonvolatile memory element of Example 1, since the nonmagnetic material is dispersed in the storage layer, it is possible to provide the nonvolatile memory element capable of operating at a high speed with a small current although having a simple configuration and structure.

Figure 4A:
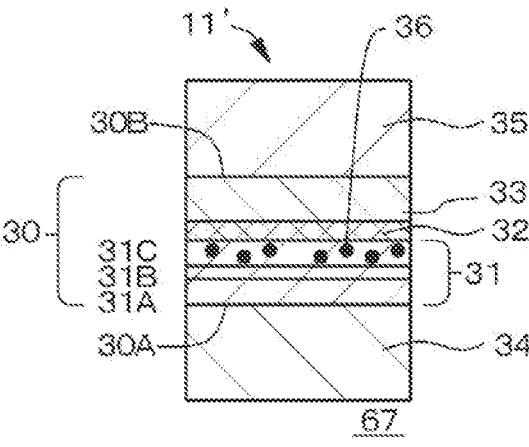
FIGS. 4A, 4B, and 4C are conceptual diagrams of Modification-1 of the nonvolatile memory element of Example 1.
Figure 4B:
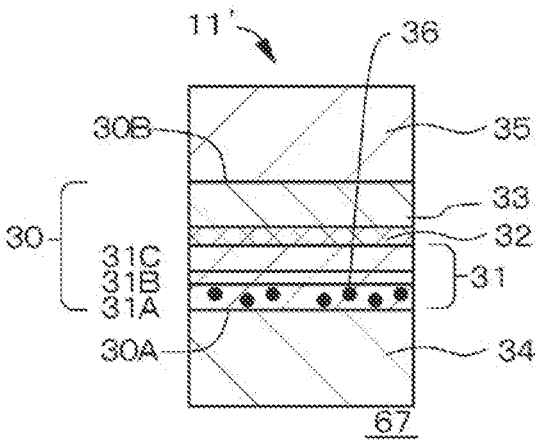
Figure 4C:
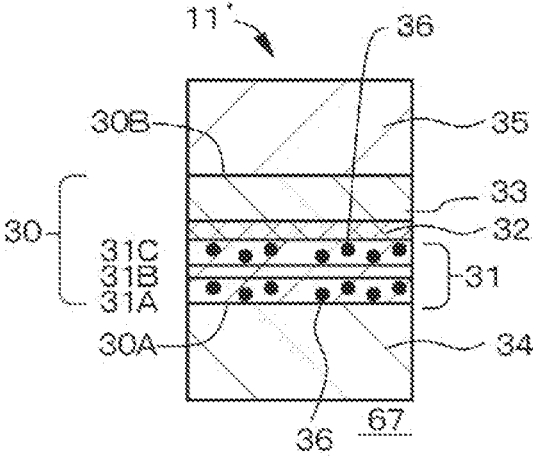

In the nonvolatile memory element 11' of Modification-1 of the nonvolatile memory element of Example 1, the nonmagnetic material 36 is dispersed in the magnetization fixed layer 31. In addition, in this case, the nonmagnetic material 36 is preferably dispersed in the magnetization fixed layer 31 in an amount of 3.3% by mass to 20% by mass. Note that, in this Modification-1, the nonmagnetic material 36 may be dispersed in one magnetic material layer (reference layer) 31C constituting the stacked ferri-structure in the magnetization fixed layer 31 (see the conceptual diagram of FIG. 4A), the nonmagnetic material 36 may be dispersed in the other magnetic material layer (fixed layer) 31A (see the conceptual diagram of FIG. 4B), or the nonmagnetic material 36 may be dispersed in the reference layer 31C and the fixed layer 31A (see the conceptual diagram of FIG. 4C). Specifically, in the formation of the magnetization fixed layer 31 in [Step-110] described above, it is only required to use a sputtering target containing a material constituting the magnetization fixed layer 31 (31A and 31C) and the nonmagnetic material 36.

It is considered that the phenomenon that the magnetization of the magnetization fixed layer 31 is erroneously reversed by spin torque can be suppressed by improving the retention characteristic of the magnetization fixed layer 31. If the erroneous reversal of the magnetization fixed layer 31 by spin torque can be suppressed, it is possible to suppress occurrence of a so-called back hopping phenomenon in which a write error occurs on a high voltage side in a case where the write voltage dependency of WER is evaluated, and as a result, the write voltage can be reduced.

Figure 5A:
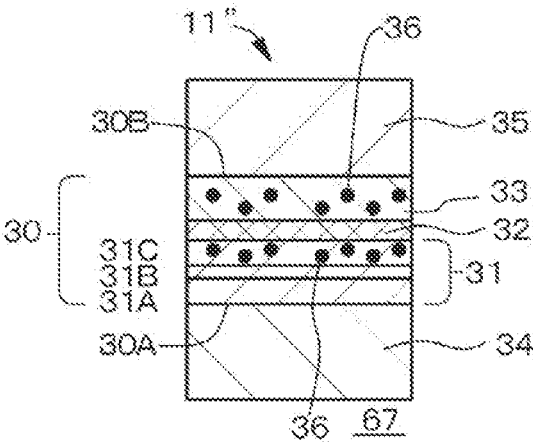
FIGS. 5A, 5B, and 5C are conceptual diagrams of Modification-2 of the nonvolatile memory element of Example 1.
Figure 5B:
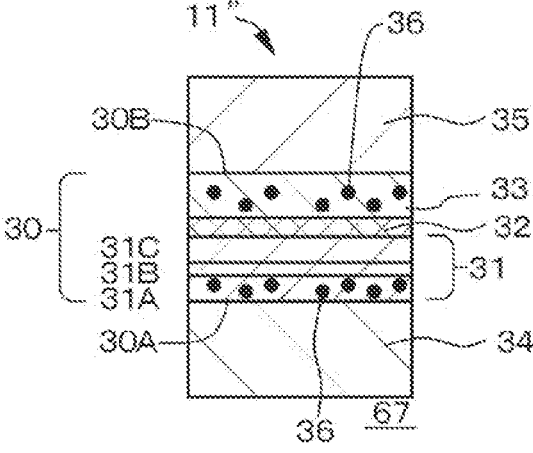
Figure 5C:
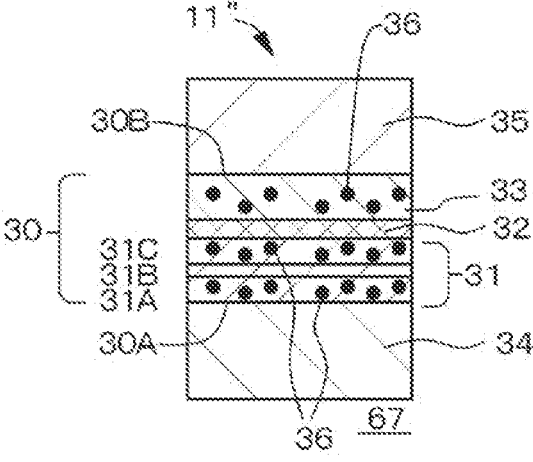

Alternatively, in the nonvolatile memory element 11″ of Modification-2 of the nonvolatile memory element of Example 1, the nonmagnetic material 36 is dispersed in the magnetization fixed layer 31 and the storage layer 33. In addition, in this case, the nonmagnetic material 36 is dispersed in the storage layer 33 in an amount of 3.3% by mass to 20% by mass, and the nonmagnetic material 36 is dispersed in the magnetization fixed layer 31 in an amount of 3.3% by mass to 20% by mass. Note that, in this Modification-2, the nonmagnetic material 36 may be dispersed in the reference layer 31C constituting the stacked ferri-structure in the magnetization fixed layer 31 (see the conceptual diagram of FIG. 5A), the nonmagnetic material 36 may be dispersed in the fixed layer 31A (see the conceptual diagram of FIG. 5B), or the nonmagnetic material 36 may be dispersed in the reference layer 31C and the fixed layer 31A (see the conceptual diagram of FIG. 5C). Specifically, in the formation of the magnetization fixed layer 31 in [Step-110] described above, it is only required to use a sputtering target containing a material constituting the magnetization fixed layer 31 (31A and 31C) and the nonmagnetic material 36, and in the formation of the storage layer 33, it is only required to use a sputtering target containing a material constituting the storage layer 33 and the nonmagnetic material 36.

Even in Modification-1 and Modification-2 of the nonvolatile memory element of Example 1 described above, characteristics and evaluation results similar to those of the nonvolatile memory element 11 of Example 1 could be obtained.

Example 2

Example 2 relates to a method for manufacturing a variable-resistance nonvolatile memory element according to a first aspect of the present disclosure.

The method for manufacturing a variable-resistance nonvolatile memory element according to Example 2 is a method for manufacturing a nonvolatile memory element having a stack 30 including at least a magnetization fixed layer 31, an intermediate layer 32, and a storage layer 33, a nonmagnetic material 36 being dispersed in the storage layer 33, the method including:

alternately stacking a storage layer-forming layer and a nonmagnetic material for forming the storage layer 33; and then subjecting the stack to heat treatment to disperse the nonmagnetic material 36 in the storage layer 33.

Figure 6A:
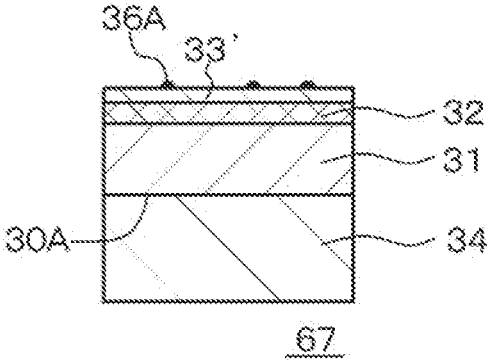
FIGS. 6A and 6B are conceptual diagrams of a stack for explaining a method for manufacturing a nonvolatile memory element according to Example 2.

Specifically, in the method for manufacturing a variable-resistance nonvolatile memory element according to Example 2, in the formation of the storage layer 33 in [Step-110] described above, the magnetization fixed layer 31 (a fixed layer 31A, a nonmagnetic layer 31B, and a reference layer 31C) and the intermediate layer 32 are continuously formed on a base layer 34 on the basis of a magnetron sputtering method. Subsequently, a storage layer-forming layer 33′ is formed on the intermediate layer 32, and a nonmagnetic material 36A is formed on the storage layer-forming layer 33′ (see FIG. 6A). Note that the thickness of the nonmagnetic material 36A at this time is a thickness less than a lattice constant of a material constituting the nonmagnetic material 36A. Specifically, molybdenum (Mo) was used as the nonmagnetic material 36A. Molybdenum (Mo) is a cubic crystal (body-centered cubic structure) and has a lattice constant a=0.31399 nm. In Example 2, a setting value of the thickness of each of the nonmagnetic materials 36A and 36B at the time of formation is 0.15 nm. As a result, the nonmagnetic materials 36A and 36B are not layered, and the formed nonmagnetic material 36A is substantially formed in an island shape. This applies to the following description similarly.

Figure 6B:
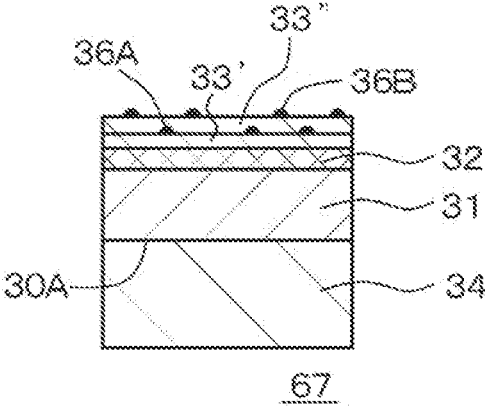

Subsequently, a storage layer-forming layer 33″ is formed on the storage layer-forming layer 33′ and the nonmagnetic material 36A, and the nonmagnetic material 36B is formed on the storage layer-forming layer 33″ (see FIG. 6B). At this time, it is only required to set the thickness of the nonmagnetic material 36B to be similar to the thickness of the nonmagnetic material 36A. Then, this step is repeated a desired number of times, and finally, a storage layer-forming layer is formed. A setting value of the thickness of each of the storage layer-forming layers (three storage layer-forming layers in Example 2) at the time of formation is 0.50 nm. Note that, although two layers of nonmagnetic materials are illustrated in the drawings, the present disclosure is not limited thereto. Furthermore, when the number of times of formation of the nonmagnetic material is represented by N, the number of times of formation of the storage layer-forming layer is (N+1).

Thereafter, a cap layer 35 is formed in a similar manner to [Step-110] of Example 1, and subsequently the cap layer 35, the stack 30, and the base layer 34 are patterned on the basis of a reactive ion etching method (RIE method) or an ion milling method (ion beam etching method). Subsequently, an insulating material layer 51 is formed on the entire surface in a similar manner to [Step-120] of Example 1, and the insulating material layer 51 is planarized such that a top surface of the insulating material layer 51 is at the same level as a top surface of the cap layer 35. Thereafter, a bit line BL (second wiring 42) in contact with the cap layer 35 is formed on the insulating material layer 51. Then, in a subsequent manufacturing process such as interlayer film formation, a temperature of 350° C. to 400° C. is usually applied, and as a result, the nonmagnetic material 36 is diffused in the storage layer 33, and the nonmagnetic material 36 is dispersed in the storage layer 33. A nonvolatile memory element having a similar configuration and structure as those described in Example 1 can be obtained. Note that the nonmagnetic material 36 is dispersed in the storage layer 33 in an amount of 3.3% by mass to 20% by mass.

In the method for manufacturing a nonvolatile memory element according to Example 2, in order to form the storage layer, the storage layer-forming layer and the nonmagnetic material are alternately stacked, and then the stack is subjected to heat treatment to disperse the nonmagnetic material in the storage layer. Therefore, a dispersion state of the nonmagnetic material in the thickness direction of the storage layer can be precisely controlled. Note that a nonvolatile memory element including the nonmagnetic material formed in a layered shape was experimentally manufactured. That is, a nonvolatile memory element in which the nonmagnetic material was not dispersed in the storage layer and was formed in a multilayer shape in the storage layer was experimentally manufactured. Then, the characteristics of such a nonvolatile memory element prototype were evaluated. Only similar values to the values of the saturation magnetization $M_S$, the anisotropic magnetic field $H_K$, and the retention characteristic of the nonvolatile memory element of Comparative Example 1 including the storage layer to which the nonmagnetic material was not added were obtained.

Example 3

Example 3 relates to a method for manufacturing a variable-resistance nonvolatile memory element according to a second aspect of the present disclosure.

The method for manufacturing a variable-resistance nonvolatile memory element according to Example 3 is a method for manufacturing a nonvolatile memory element having a stack 30 including at least a magnetization fixed layer 31, an intermediate layer 32, and a storage layer 33, a nonmagnetic material 36 being dispersed in the magnetization fixed layer 31, the method including:

alternately stacking a magnetization fixed layer-forming layer and a nonmagnetic material for forming the magnetization fixed layer 31; and then subjecting the stack to heat treatment to disperse the nonmagnetic material in the magnetization fixed layer.

Figure 7A:
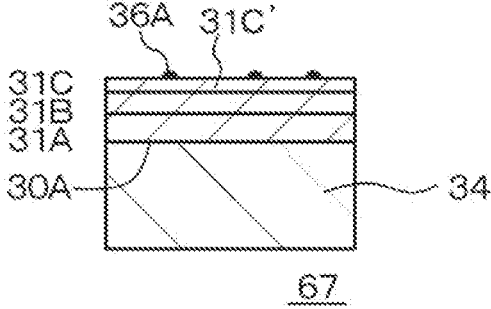
FIGS. 7A and 7B are conceptual diagrams of a stack for explaining a method for manufacturing a nonvolatile memory element according to Example 3.
Figure 7B:
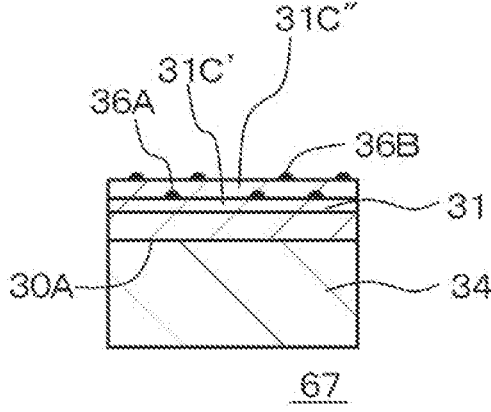

Specifically, in the method for manufacturing a variable-resistance nonvolatile memory element according to Example 3, in the formation of the magnetization fixed layer 31 in [Step-110] described above, a fixed layer 31A and a nonmagnetic layer 31B are sequentially formed on a base layer 34. Next, a reference layer 31C is formed on the nonmagnetic layer 31B. At this time, in a case where the nonmagnetic material 36 is dispersed in the reference layer 31C, a magnetization fixed layer-forming layer (reference layer-forming layer 31C') is formed on the basis of a similar method to Example 2, and a nonmagnetic material 36A is formed on the reference layer-forming layer 31C' (see FIG. 7A). Subsequently, a reference layer-forming layer 31C" is formed on the reference layer-forming layer 31C' and the nonmagnetic material 36A, and a nonmagnetic material 36B is formed on the reference layer-forming layer 31C" (see FIG. 7B). Then, this step is repeated a desired number of times, and finally, a storage layer-forming layer is formed. Note that, although two layers of nonmagnetic materials are illustrated in the drawings, the present disclosure is not limited thereto. Furthermore, when the number of times of formation of the nonmagnetic material is represented by N, the number of times of formation of the magnetization fixed layer-forming layer is (N+1).

Thereafter, the intermediate layer 32, the storage layer 33, and a cap layer 35 are formed in a similar manner to [Step-110] of Example 1, and subsequently the cap layer 35, the stack 30, and the base layer 34 are patterned on the basis of a reactive ion etching method (RIE method) or an ion milling method (ion beam etching method). Subsequently, an insulating material layer 51 is formed on the entire surface in a similar manner to [Step-120] of Example 1, and the insulating material layer 51 is planarized such that a top surface of the insulating material layer 51 is at the same level as a top surface of the cap layer 35. Thereafter, the bit line BL (second wiring 42) in contact with the cap layer 35 is formed on the insulating material layer 51. Then, in a subsequent manufacturing process such as interlayer film formation, a temperature of 350° C. to 400° C. is usually applied, and as a result, the nonmagnetic material 36 is diffused in the reference layer 31C, and the nonmagnetic material 36 is dispersed in the reference layer 31C. A nonvolatile memory element having a similar configuration and structure as those described in Example 1 can be obtained. Note that the nonmagnetic material 36 is dispersed in the magnetization fixed layer 31 (more specifically, in the reference layer 31C) in an amount of 3.3% by mass to 20% by mass.

In the method for manufacturing a nonvolatile memory element according to Example 3, in order to form the magnetization fixed layer, the magnetization fixed layer-forming layer and the nonmagnetic material are alternately stacked, and then the stack is subjected to heat treatment to disperse the nonmagnetic material in the magnetization fixed layer. Therefore, a dispersion state of the nonmagnetic material in the thickness direction of the magnetization fixed layer can be precisely controlled. Note that a nonvolatile memory element including the nonmagnetic material formed in a layered shape was experimentally manufactured. That is, a nonvolatile memory element in which the nonmagnetic material was not dispersed in the magnetization fixed layer and was formed in a multilayer shape in the magnetization fixed layer was experimentally manufactured. Then, the characteristics of such a nonvolatile memory element prototype were evaluated. Only similar values to the values of the saturation magnetization $M_S$, the anisotropic magnetic field $H_K$, and the retention characteristic of the nonvolatile memory element including the magnetization fixed layer to which the nonmagnetic material was not added were obtained.

Note that the nonmagnetic material 36 may be dispersed in the fixed layer 31A, or the nonmagnetic material 36 may be dispersed in the fixed layer 31A and the reference layer 31C by a similar method to the reference layer 31C.

Furthermore, by alternately stacking the magnetization fixed layer-forming layer and the nonmagnetic material 36 for forming the magnetization fixed layer 31, alternately stacking the storage layer-forming layer and the nonmagnetic material 36 for forming the storage layer 33, and then subjecting the stack to heat treatment, the nonmagnetic material 36 can be dispersed in the magnetization fixed layer 31 and the storage layer 33. Specifically, by combining Examples 2 and 3, the nonmagnetic material 36 may be dispersed in the reference layer 31C and the storage layer 33, the nonmagnetic material 36 may be dispersed in the fixed layer 31A and the storage layer 33, or the nonmagnetic material 36 may be dispersed in the fixed layer 31A, the reference layer 31C, and the storage layer 33. In this case, the nonmagnetic material 36 can be dispersed in the storage layer 33 in an amount of 3.3% by mass to 20% by mass, and the nonmagnetic material 36 can be dispersed in the magnetization fixed layer 31 in an amount of 3.3% by mass to 20% by mass.

Example 4

Figure 8:
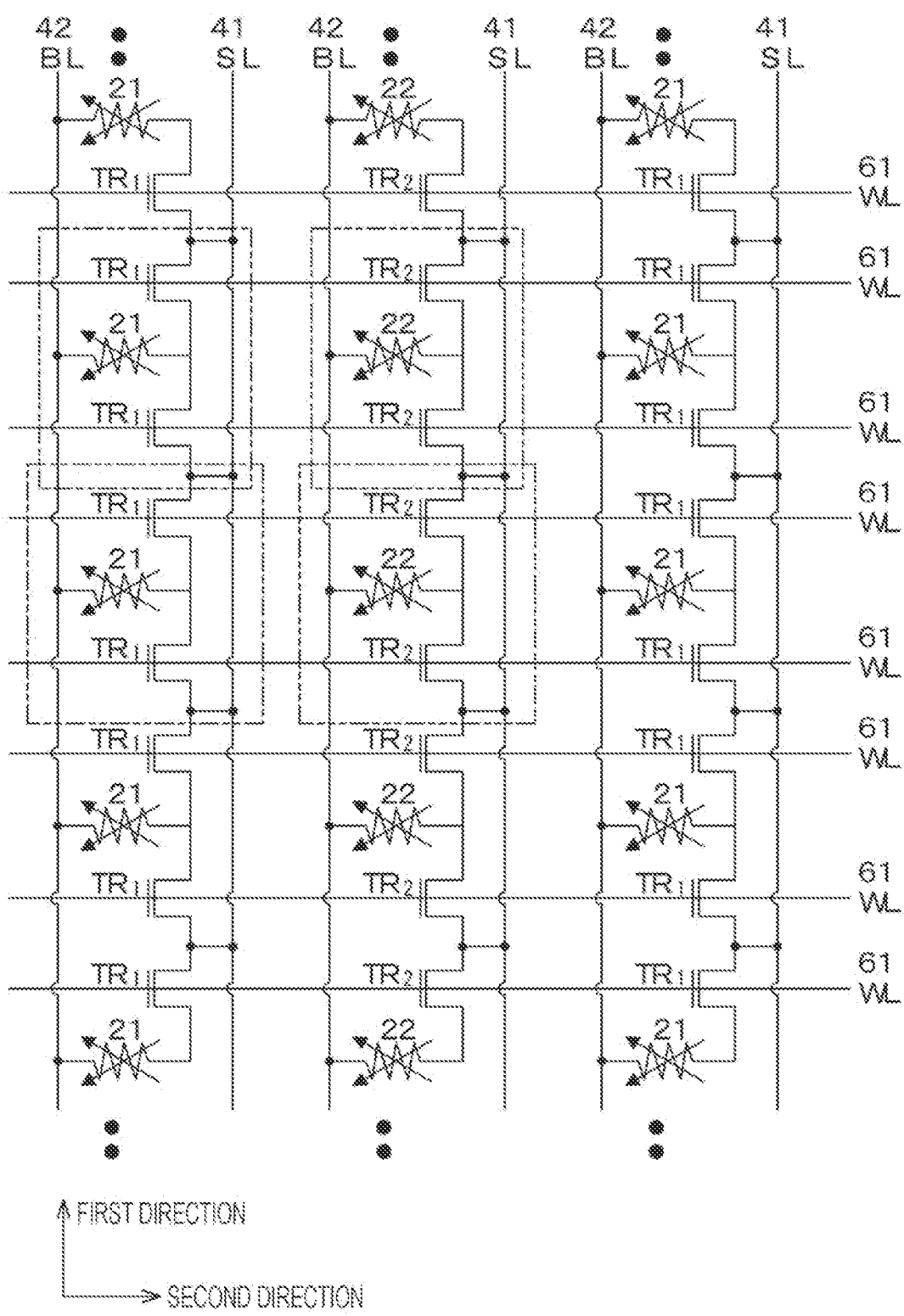
FIG. 8 is an equivalent circuit diagram of a memory cell array in Example 4.

Example 4 is a modification of Examples 1 to 3. FIG. 8 illustrates an equivalent circuit diagram of the nonvolatile memory element of Example 4. Note that in FIG. 8, one memory cell is surrounded by a two-dot chain line, and another memory cell is surrounded by a three-dot chain line.

In the memory cell array of Example 4, the memory cell includes one nonvolatile memory element 21, 22 and two selection transistors $TR_1$, $TR_2$ (see the memory cell surrounded by a two-dot chain line or a three-dot chain line). The memory cell constituting the memory cell array of Example 4 is a so-called "2T-1R" type memory cell, and the nonvolatile memory elements of Examples 1 to 3 can also be applied to the nonvolatile memory element 21, 22 of such a "2T-1R" type memory cell.

The configuration and structure of the nonvolatile memory element of Example 4 can be similar to those of the nonvolatile memory elements of Examples 1 to 3 except for the above points, and therefore detailed description thereof will be omitted.

Example 5

Figure 9:
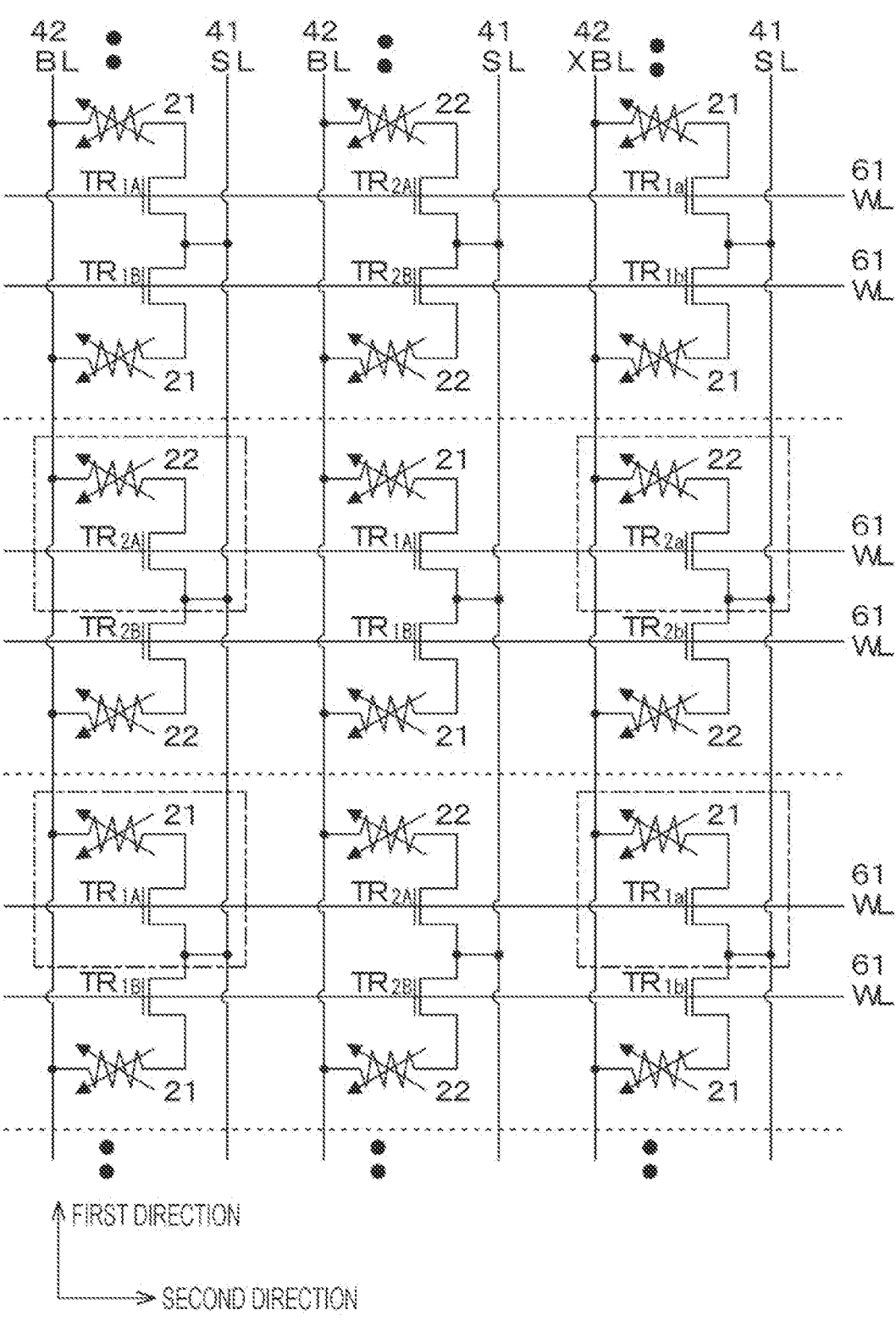
FIG. 9 is an equivalent circuit diagram of a memory cell array in Example 5.

Example 5 is a modification of Examples 1 to 3. FIG. 9 illustrates an equivalent circuit diagram of the nonvolatile memory element of Example 5. Note that in FIG. 9, the memory cells operating in pairs are surrounded by a one-dot chain line, and another memory cell operating in pairs are surrounded by a two-dot chain line.

In the memory cell array of Example 5, the memory cell includes two nonvolatile memory elements 21, 22 and two selection transistors $TR_{1A}$, $TR_{1B}$, $TR_{1a}$, $TR_{1b}$, $TR_{2A}$, $TR_{2B}$, $TR_{2a}$, $TR_{2b}$. The memory cell of Example 5 is a so-called "2T-2R" type memory cell. By using such a "2T-2R" type memory cell and storing one piece of data in two memory cells (2 bits), a speed of a data reading circuit can be increased. Note that one of the paired memory cells is connected to a bit line BL, and the other is connected to a bit line XBL.

The configuration and structure of the nonvolatile memory element of Example 5 can be similar to those of the nonvolatile memory elements of Examples 1 to 3 except for the above points, and therefore detailed description thereof will be omitted.

Example 6

Example 6 relates to an electronic device including the nonvolatile memory element described in Examples 1 to 5, specifically, a magnetic head. The magnetic head can be applied to, for example, a hard disk drive, an integrated circuit chip, a personal computer, a mobile terminal, a mobile phone, various electronic devices including a magnetic sensor device, an electric device, and the like.

Figure 17A:
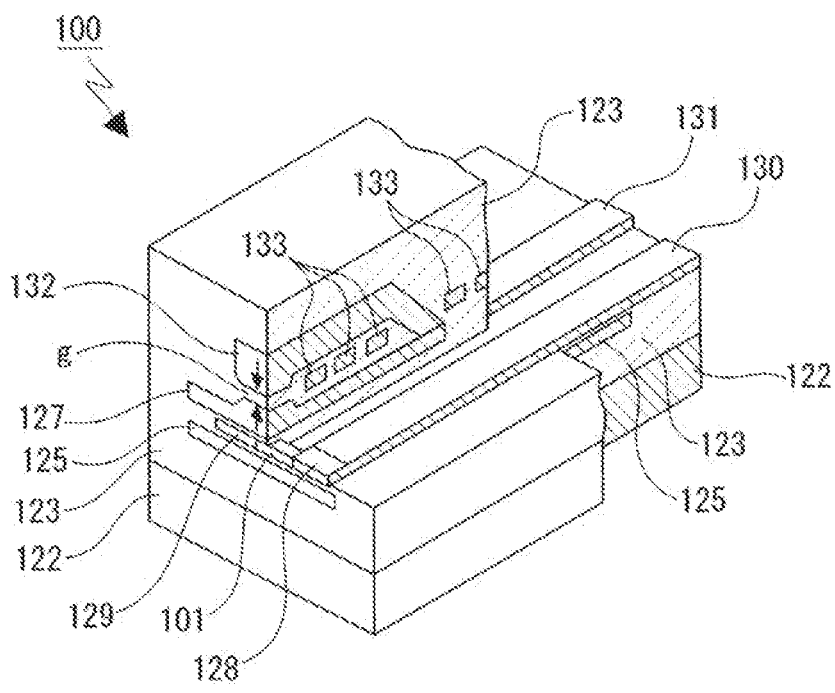
FIGS. 17A and 17B are a schematic perspective view illustrating a combined magnetic head of Example 6 with a part cut away, and a schematic cross-sectional view of the combined magnetic head of Example 6, respectively.
Figure 17B:
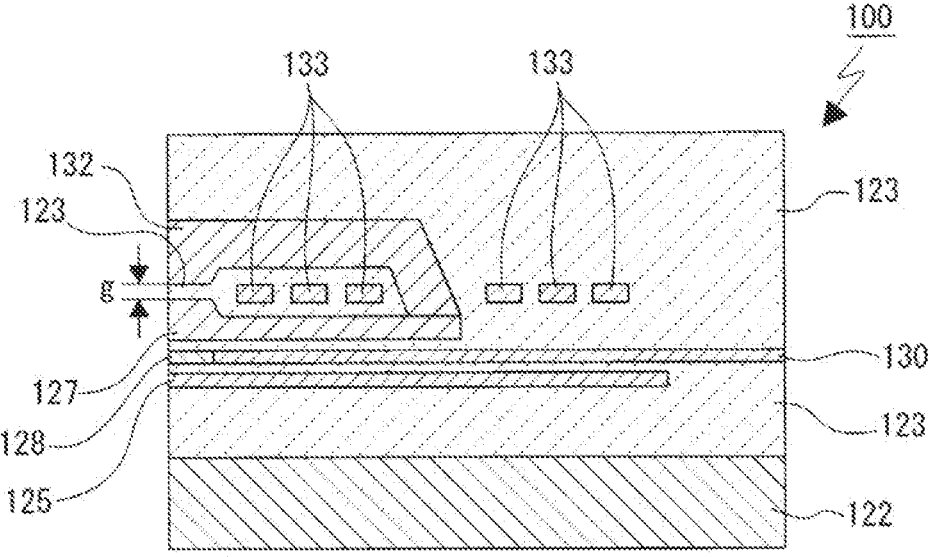

As an example, FIGS. 17A and 17B illustrate an example in which a magnetoresistor 101 including the nonvolatile memory element described in Example 1 to Example 5 is applied to a combined magnetic head 100. Note that FIG. 17A is a schematic perspective view illustrating of the combined magnetic head 100 with a part cut away such that an internal structure thereof can be seen, and FIG. 17B is a schematic cross-sectional view of the combined magnetic head 100.

The combined magnetic head 100 is a magnetic head used for a hard disk device or the like. A magnetoresistive effect type magnetic head including the nonvolatile memory element (memory cell array) described in Examples 1 to 5 is formed on a substrate 122, and an inductive type magnetic head is further stacked on the magnetoresistive effect type magnetic head. Here, the magnetoresistive effect type magnetic head operates as a reproducing head, and the inductive type magnetic head operates as a recording head. That is, in the combined magnetic head 100, the reproducing head and the recording head are combined.

The magnetoresistive effect type magnetic head included in the combined magnetic head 100 is a so-called shield type MR head, and includes a first magnetic shield layer 125 formed on the substrate 122 via an insulating layer 123, a magnetoresistor 101 formed on the first magnetic shield layer 125 via the insulating layer 123, and a second magnetic shield layer 127 formed on the magnetoresistor 101 via the insulating layer 123. The insulating layer 123 includes an insulating material such as $Al_2O_3$ or $SiO_2$. The first magnetic shield layer 125 is formed for magnetically shielding a lower layer side of the magnetoresistor 101, and includes a soft magnetic material such as Ni—Fe. The magnetoresistor 101 is formed on the first magnetic shield layer 125 via the insulating layer 123. The magnetoresistor 101 functions as a magnetism sensing element that detects a magnetic signal from a magnetic recording medium in the magnetoresistive effect type magnetic head. The magnetoresistor 101 has a substantially rectangular shape, and one side surface thereof is exposed as a surface facing the magnetic recording medium. In addition, bias layers 128 and 129 are formed at both ends of the magnetoresistor 101. Furthermore, connection terminals 130 and 131 connected to the bias layer 128 and 129 are formed. A sense current is supplied to the magnetoresistor 101 via the connection terminals 130 and 131. The second magnetic shield layer 127 is formed above the bias layers 128 and 129 via the insulating layer 123.

The inductive type magnetic head stacked on the magnetoresistive effect type magnetic head includes a magnetic core including the second magnetic shield layer 127 and an upper layer core 132, and a thin film coil 133 formed so as to wind the magnetic core. The upper layer core 132 forms a closed magnetic path together with the second magnetic shield layer 127, serves as a magnetic core of the inductive type magnetic head, and includes a soft magnetic material such as Ni—Fe. Here, the second magnetic shield layer 127 and the upper layer core 132 are formed such that front ends thereof are exposed as surfaces facing the magnetic recording medium, and the second magnetic shield layer 127 and the upper layer core 132 are in contact with each other at rear ends thereof. Here, the front ends of the second magnetic shield layer 127 and the upper layer core 132 are formed such that the second magnetic shield layer 127 and the upper layer core 132 are separated from each other with a predetermined gap g on the facing surface of the magnetic recording medium. That is, in the combined magnetic head 100, the second magnetic shield layer 127 not only magnetically shields an upper layer side of the magnetoresistor 101, but also serves as the magnetic core of the inductive type magnetic head, and the second magnetic shield layer 127 and the upper layer core 132 constitute the magnetic core of the inductive type magnetic head. In addition, the gap g is a recording magnetic gap of the inductive type magnetic head.

Furthermore, on the second magnetic shield layer 127, the thin film coil 133 embedded in the insulating layer 123 is formed. The thin film coil 133 is formed so as to wind the magnetic core including the second magnetic shield layer 127 and the upper layer core 132. Although not illustrated, both ends of the thin film coil 133 are exposed to the outside, and terminals formed at both ends of the thin film coil 133 serve as external connection terminals of the inductive type magnetic head. That is, at the time of recording a magnetic signal on the magnetic recording medium, a recording current is supplied from these external connection terminals to the thin film coil 133.

The combined magnetic head 100 as described above includes the magnetoresistive effect type magnetic head as a reproducing head, and the magnetoresistive effect type magnetic head includes the magnetoresistor 101 described in Examples 1 to 5 as a magnetism sensitive element that detects a magnetic signal from a magnetic recording medium. In addition, since the magnetoresistor 101 exhibits very excellent characteristics as described above, this magnetoresistive effect type magnetic head can respond to further increase in recording density of magnetic recording.

Hitherto, the present disclosure has been described on the basis of preferable Examples. However, the present disclosure is not limited to these Examples. Various stacked structures constituting the nonvolatile memory element described in Examples, materials used, and the like are illustrative, and can be appropriately changed.

Figure 18A:
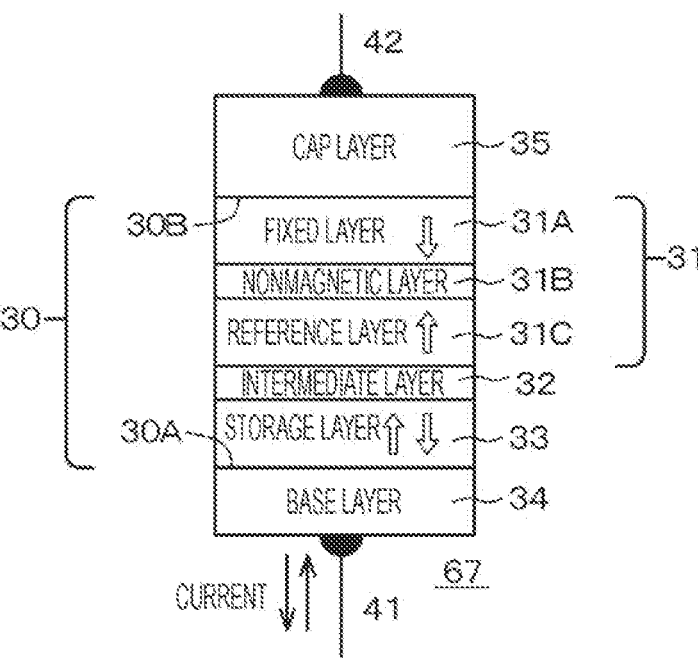
FIGS. 18A and 18B are conceptual diagrams of Modifications of the nonvolatile memory element.
Figure 18B:
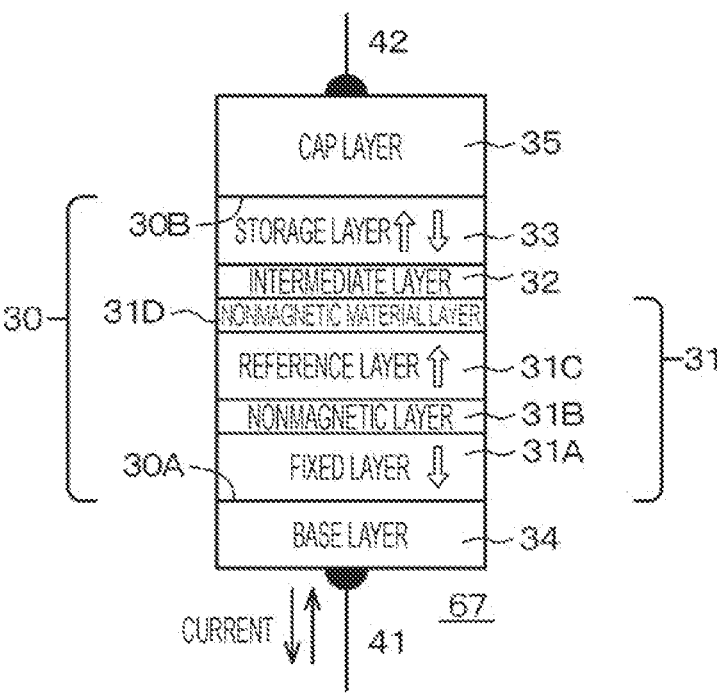

As illustrated in the conceptual diagram of Modification of the nonvolatile memory element in FIG. 18A, in each Example, the spin transfer torque based magnetic random access memory having a structure in which the storage layer 33 is located at the uppermost layer of the stack 30 has been described. However, by reversing the order of stacking the layers in the stack 30, a spin transfer torque based magnetic random access memory having a structure in which the storage layer 33 is located at the lowermost layer in the stack 30 can also be used. Alternatively, as illustrated in the conceptual diagram of Modification of the nonvolatile memory element in FIG. 18B, the stacked ferri-structure may further include a nonmagnetic material layer 31D containing at least one element selected from the group consisting of vanadium, chromium, niobium, molybdenum, tantalum, tungsten, hafnium, zirconium, titanium, and ruthenium between one magnetic material layer (reference layer) 31C and the stack 30 constituting the stacked ferri-structure.

Furthermore, the insulating material layer 51 can have magnetism. In this case, it is only required to constitute the insulating material layer 51 by, for example, iron oxide ($FeO_x$).

The base portion is constituted by the silicon semiconductor substrate in Examples, but can be alternatively constituted by an SOI substrate (specifically, a silicon layer constituting an SOI substrate or the like). Alternatively, the base portion can be constituted by an InGaAs layer or a Ge layer instead of the silicon layer, and the selection transistor TR can be formed in the InGaAs layer or the Ge layer.

Note that the present disclosure can have the following configurations.

[A01]<<Variable-Resistance Nonvolatile Memory Element>>

A variable-resistance nonvolatile memory element having a stack including at least a magnetization fixed layer, an intermediate layer, and a storage layer, in which a nonmagnetic material is dispersed in at least one of the magnetization fixed layer and the storage layer.

[A02] The nonvolatile memory element according to [A01], in which the nonmagnetic material is at least one nonmagnetic material selected from the group consisting of niobium (Nb), tungsten (W), tantalum (Ta), iridium (Ir), chromium (Cr), molybdenum (Mo), titanium (Ti), ruthenium (Ru), magnesium (Mg), MgO, zirconium (Zr), and hafnium (Hf), or an alloy material including two or more of the nonmagnetic materials.

[A03] The nonvolatile memory element according to [A01] or [A02], in which the nonmagnetic material is dispersed in the storage layer.

[A04] The nonvolatile memory element according to [A03], in which the nonmagnetic material is dispersed in the storage layer in an amount of 3.3% by mass to 20% by mass.

[A05] The nonvolatile memory element according to [A01] or [A02], in which the nonmagnetic material is dispersed in the magnetization fixed layer.

[A06] The nonvolatile memory element according to [A05], in which the nonmagnetic material is dispersed in the magnetization fixed layer in an amount of 3.3% by mass to 20% by mass.

[A07] The nonvolatile memory element according to [A01] or [A02], in which the nonmagnetic material is dispersed in the magnetization fixed layer and the storage layer.

[A08] The nonvolatile memory element according to [A07], in which the nonmagnetic material is dispersed in the storage layer in an amount of 3.3% by mass to 20% by mass, and the nonmagnetic material is dispersed in the magnetization fixed layer in an amount of 3.3% by mass to 20% by mass.

[A09] The nonvolatile memory element according to any one of [A01] to [A08], in which a write voltage dependency of a write error rate is steeper than a write voltage dependency of a write error rate in a nonvolatile memory element in which the nonmagnetic material is not dispersed.

[A10] The nonvolatile memory element according to [A09], satisfying $$1 < [\partial(WER_1)/\partial(V_W)]/[\partial(WER_0)/\partial(V_W)]$$

$WER_1$ represents the write error rate, $WER_0$ represents the write error rate in the nonvolatile memory element in which the nonmagnetic material is not dispersed, and $V_W$ represents a write voltage.

[B01] <<Method for Manufacturing Variable-Resistance Nonvolatile Memory Element•••First Aspect>>

A method for manufacturing a variable-resistance nonvolatile memory element having a stack including at least a magnetization fixed layer, an intermediate layer, and a storage layer, a nonmagnetic material being dispersed in the storage layer, the method including:

alternately stacking a storage layer-forming layer and a nonmagnetic material for forming the storage layer; and then subjecting the stack to heat treatment to disperse the nonmagnetic material in the storage layer.

[B02] The method for manufacturing a nonvolatile memory element according to [B01], in which the nonmagnetic material has a thickness less than a lattice constant of a material constituting the nonmagnetic material.

[B03] The method for manufacturing a nonvolatile memory element according to [B01] or [B02], in which the nonmagnetic material is dispersed in the storage layer in an amount of 3.3% by mass to 20% by mass.

[C01] <<Method for Manufacturing Variable-Resistance Nonvolatile Memory Element•••Second Aspect>>

A method for manufacturing a variable-resistance nonvolatile memory element having a stack including at least a magnetization fixed layer, an intermediate layer, and a storage layer, a nonmagnetic material being dispersed in the magnetization fixed layer, the method including:

alternately stacking a magnetization fixed layer-forming layer and the nonmagnetic material for forming the magnetization fixed layer; and then subjecting the stack to heat treatment to disperse the nonmagnetic material in the magnetization fixed layer.

[C02] The method for manufacturing a nonvolatile memory element according to [C01], in which the nonmagnetic material has a thickness less than a lattice constant of a material constituting the nonmagnetic material.

[C03] The method for manufacturing a nonvolatile memory element according to [C01] or [C02], in which the nonmagnetic material is dispersed in the magnetization fixed layer in an amount of 3.3% by mass to 20% by mass.

[C04] The method for manufacturing a nonvolatile memory element according to any one of [C01] to [C03], the method including: alternately stacking the magnetization fixed layer-forming layer and the nonmagnetic material for forming the magnetization fixed layer; alternately stacking a storage layer-forming layer and the nonmagnetic material for forming the storage layer; and then subjecting the stack to heat treatment to disperse the nonmagnetic material in the magnetization fixed layer and the storage layer.

[C05] The method for manufacturing a nonvolatile memory element according to [C04], in which the nonmagnetic material for forming the storage layer has a thickness less than a lattice constant of a material constituting the nonmagnetic material.

[C06] The method for manufacturing a nonvolatile memory element according to [C04] or [C05], in which the nonmagnetic material in the storage layer is dispersed in the magnetization fixed layer in an amount of 3.3% by mass to 20% by mass.

[D01] <<Electronic Device>>

An electronic device including the nonvolatile memory element according to any one of [A01] to [A10].

| REFERENCE SIGNS LIST | |
|---|---|
| 11, 11', 11", 21, 22 | Nonvolatile memory element |
| 30 | Stack |
| 30A | First surface of stack |
| 30B | Second surface of stack |
| 31 | Magnetization fixed layer |
| 31A | Fixed layer |
| 31B | Nonmagnetic layer |
| 31C | Reference layer |
| 31C', 31C" | Reference layer-forming layer |
| 31D | Nonmagnetic material layer |
| 32 | Intermediate layer |
| 33 | Storage layer (magnetization reversal layer or free layer) |
| 33', 33" | Storage layer-forming layer |
| 34 | Base layer |
| 35 | Cap layer |
| 36 | Nonmagnetic material |
| 41 | First wiring |
| 42 | Second wiring |
| 51 | Insulating material layer |
| 60 | Base portion (semiconductor substrate) |
| 61 | Gate electrode |
| 62 | Gate insulating layer |
| 63 | Channel forming region |
| 64A, 64B | Source/drain region |
| 65 | Connection hole |
| 66, | Contact hole |
| 67 | Interlayer insulating layer |
| 100 | Combined magnetic head |
| 101 | Magnetoresistor |
| 122 | Substrate |
| 123 | Insulating layer |
| 125 | First magnetic shield layer |
| 127 | Second magnetic shield layer |
| 128, 129 | Bias layer |
| 130, 131 | Connection terminal |
| 132 | Upper layer |
| 133 | Thin film coil |
| g | Gap |
| TR, $TR_1$, $TR_2$, $TR_{1A}$, $TR_{1B}$, $TR_{1a}$, $TR_{1b}$, $TR_{2A}$, $TR_{2B}$, $TR_{2a}$, $TR_{2b}$ | Selection transistor |
| TR' | Element separating transistor |
| WL | Word line |

-continued

| REFERENCE SIGNS LIST | |
|---|---|
| BL | Bit line |
| SL | Sense line |

The invention claimed is:

1. A variable-resistance nonvolatile memory element comprising a stack including at least a magnetization fixed layer, an intermediate layer, and a storage layer, wherein
   a nonmagnetic material is dispersed in at least one of the magnetization fixed layer and the storage layer, and
   the nonmagnetic material is dispersed in the magnetization fixed layer.

2. The nonvolatile memory element according to claim 1, wherein the nonmagnetic material is at least one nonmagnetic material selected from the group consisting of niobium (Nb), tungsten (W), tantalum (Ta), iridium (Ir), chromium (Cr), molybdenum (Mo), titanium (Ti), ruthenium (Ru), magnesium (Mg), MgO, zirconium (Zr), and hafnium (Hf), or an alloy material including two or more of the nonmagnetic materials.

3. The nonvolatile memory element according to claim 1, wherein the nonmagnetic material is dispersed in the storage layer.

4. The nonvolatile memory element according to claim 3, wherein the nonmagnetic material is dispersed in the storage layer in an amount of 3.3% by mass to 20% by mass.

5. The nonvolatile memory element according to claim 1, wherein the nonmagnetic material is dispersed in the magnetization fixed layer in an amount of 3.3% by mass to 20% by mass.

6. The nonvolatile memory element according to claim 1, wherein the nonmagnetic material is dispersed in the storage layer.

7. The nonvolatile memory element according to claim 6, wherein
   the nonmagnetic material is dispersed in the storage layer in an amount of 3.3% by mass to 20% by mass, and
   the nonmagnetic material is dispersed in the magnetization fixed layer in an amount of 3.3% by mass to 20% by mass.

8. The nonvolatile memory element according to claim 1, wherein a write voltage dependency of a write error rate is steeper than a write voltage dependency of a write error rate in a different nonvolatile memory element comprising a second stack including at least a second magnetization fixed layer, a second intermediate layer, and a second storage layer in which the nonmagnetic material is not dispersed in the second magnetization fixed layer.

9. The nonvolatile memory element according to claim 8, satisfying $$1 < [\partial(WER_1)/\partial(V_W)]/[\partial(WER_0)/\partial(V_W)], \text{ wherein}$$

$WER_1$ represents the write error rate, $WER_0$ represents the write error rate in the different nonvolatile memory element in which the nonmagnetic material is not dispersed, and $V_W$ represents a write voltage.

10. A variable-resistance nonvolatile memory element comprising a stack including at least a magnetization fixed layer, an intermediate layer, and a storage layer, wherein
   a nonmagnetic material is dispersed in at least one of the magnetization fixed layer and the storage layer, and
   a write voltage dependency of a write error rate is steeper than a write voltage dependency of a write error rate in a different nonvolatile memory element comprising a second stack including at least a second magnetization fixed layer, a second intermediate layer, and a second storage layer in which the nonmagnetic material is not dispersed in the second magnetization fixed layer.

11. The nonvolatile memory element according to claim 10, satisfying $$1 < [\partial(WER_1)/\partial(V_W)]/[\partial(WER_0)/\partial(V_W)], \text{ wherein}$$

$WER_1$ represents the write error rate, $WER_0$ represents the write error rate in the different nonvolatile memory element in which the nonmagnetic material is not dispersed, and $V_W$ represents a write voltage.

12. The nonvolatile memory element according to claim 10, wherein the nonmagnetic material is at least one nonmagnetic material selected from the group consisting of niobium (Nb), tungsten (W), tantalum (Ta), iridium (Ir), chromium (Cr), molybdenum (Mo), titanium (Ti), ruthenium (Ru), magnesium (Mg), MgO, zirconium (Zr), and hafnium (Hf), or an alloy material including two or more of the nonmagnetic materials.

13. The nonvolatile memory element according to claim 12, wherein the nonmagnetic material is dispersed in the storage layer.

14. The nonvolatile memory element according to claim 13, wherein the nonmagnetic material is dispersed in the storage layer in an amount of 3.3% by mass to 20% by mass.

\* \* \* \* \*